(12) United States Patent
Wang et al.

(10) Patent No.: US 10,529,675 B2
(45) Date of Patent: Jan. 7, 2020

(54) INFO STRUCTURE AND METHOD FORMING SAME

(71) Applicant: Taiwan Semiconductor Manufacturing Company, Ltd., Hsinchu (TW)

(72) Inventors: Po-Han Wang, Hsinchu (TW); Yu-Hsiang Hu, Hsinchu (TW); Hung-Jui Kuo, Hsinchu (TW); Chen-Hua Yu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/403,878

(22) Filed: May 6, 2019

(65) Prior Publication Data

US 2019/0259714 A1 Aug. 22, 2019

Related U.S. Application Data

(62) Division of application No. 15/939,615, filed on Mar. 29, 2018, now Pat. No. 10,283,461.

(Continued)

(51) Int. Cl.
*H01L 23/58* (2006.01)
*H01L 23/31* (2006.01)

(Continued)

(52) U.S. Cl.
CPC ........ *H01L 23/585* (2013.01); *H01L 21/4857* (2013.01); *H01L 21/568* (2013.01); *H01L 21/6835* (2013.01); *H01L 23/3128* (2013.01); *H01L 23/485* (2013.01); *H01L 24/19* (2013.01); *H01L 24/20* (2013.01); *H01L 21/561* (2013.01); *H01L 25/105* (2013.01); *H01L 25/50* (2013.01); *H01L 2221/68345* (2013.01); *H01L 2221/68372* (2013.01); *H01L 2221/68381* (2013.01); *H01L 2224/04105* (2013.01); *H01L 2224/12105* (2013.01); *H01L 2224/16227* (2013.01); *H01L 2224/32225* (2013.01);

(Continued)

(58) Field of Classification Search
CPC ... H01L 23/585; H01L 21/6835; H01L 24/19; H01L 24/20; H01L 23/485; H01L 21/4857

See application file for complete search history.

(56) References Cited

U.S. PATENT DOCUMENTS 9,904,776 B2 2/2018 Huang et al.
10,032,704 B2 7/2018 Chen (Continued)

FOREIGN PATENT DOCUMENTS

KR 20160006094 A 1/2016
KR 20160100230 A 8/2016

(Continued)

*Primary Examiner* — Anthony Ho
(74) *Attorney, Agent, or Firm* — Slater Matsil, LLP

(57) ABSTRACT

A method includes encapsulating a package component in an encapsulating material, with the encapsulating material including a portion directly over the package component. The portion of the encapsulating material is patterned to form an opening revealing a conductive feature in the package component. A redistribution line extends into the opening to contact the conductive feature. An electrical connector is formed over and electrically coupling to the conductive feature.

20 Claims, 30 Drawing Sheets

Related U.S. Application Data

(60) Provisional application No. 62/589,892, filed on Nov. 22, 2017.

(51) Int. Cl.

| | |
|---|---|
| *H01L 21/48* | (2006.01) |
| *H01L 21/56* | (2006.01) |
| *H01L 23/485* | (2006.01) |
| *H01L 23/00* | (2006.01) |
| *H01L 21/683* | (2006.01) |
| *H01L 25/10* | (2006.01) |
| *H01L 25/00* | (2006.01) |

(52) U.S. Cl.
CPC ............... *H01L 2224/73267* (2013.01); *H01L 2224/92244* (2013.01); *H01L 2225/1035* (2013.01); *H01L 2225/1041* (2013.01); *H01L 2225/1058* (2013.01); *H01L 2225/1082* (2013.01); *H01L 2924/1434* (2013.01); *H01L 2924/1436* (2013.01); *H01L 2924/15311* (2013.01)

(56) References Cited

U.S. PATENT DOCUMENTS

| | | |
|---|---|---|
| 10,043,778 B2 | 8/2018 | Yu et al. |
| 2017/0062360 A1 | 3/2017 | Chang et al. |
| 2017/0323840 A1 | 11/2017 | Chiu et al. |
| 2017/0323853 A1 | 11/2017 | Hu et al. |

FOREIGN PATENT DOCUMENTS

| | | |
|---|---|---|
| KR | 20160132053 A | 11/2016 |
| TW | 201729139 A | 8/2017 |
| WO | 2015138359 A1 | 9/2015 |

INFO STRUCTURE AND METHOD FORMING SAME

PRIORITY CLAIM AND CROSS-REFERENCE

This application is a divisional of U.S. patent application Ser. No. 15/939,615, entitled "Info Structure and Method Forming Same," filed on Mar. 29, 2018, which claims the benefit of the following provisionally filed U.S. patent application: Application Ser. No. 62/589,892, filed Nov. 22, 2017, and entitled "Low-cost Info Structure and Method Forming Same," which applications are hereby incorporated herein by reference.

BACKGROUND

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises quickly over time. As a result, the packaging of the semiconductor dies becomes more difficult, which adversely affects the yield of the packaging.

Conventional package technologies can be divided into two categories. In the first category, dies on a wafer are packaged before they are sawed. This packaging technology has some advantageous features, such as a greater throughput and a lower cost. Further, less underfill or molding compound is needed. However, this packaging technology also suffers from drawbacks. Since the sizes of the dies are becoming increasingly smaller, and the respective packages can only be fan-in type packages, in which the I/O pads of each die are limited to a region directly over the surface of the respective die, with the limited areas of the dies, the number of the I/O pads is limited due to the limitation of the pitch of the I/O pads. If the pitch of the pads is to be decreased, solder bridges may occur. Additionally, under the fixed ball-size requirement, solder balls must have a certain size, which in turn limits the number of solder balls that can be packed on the surface of a die.

In the other category of packaging, dies are sawed from wafers before they are packaged. An advantageous feature of this packaging technology is the possibility of forming fan-out packages, which means the I/O pads on a die can be redistributed to a greater area than the die, and hence the number of I/O pads packed on the surfaces of the dies can be increased. Another advantageous feature of this packaging technology is that "known-good-dies" are packaged, and defective dies are discarded, and hence cost and effort are not wasted on the defective dies.

In a fan-out package, a device dies is encapsulated in a molding compound, which is then planarized to expose the device die. Dielectric layers are formed over the device dies. Redistribution lines are formed in the dielectric layers to connect to the device die. Seal rings may be formed in the dielectric layers when the redistribution lines are formed. The fan-out package may also include through-vias penetrating through the molding compound.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
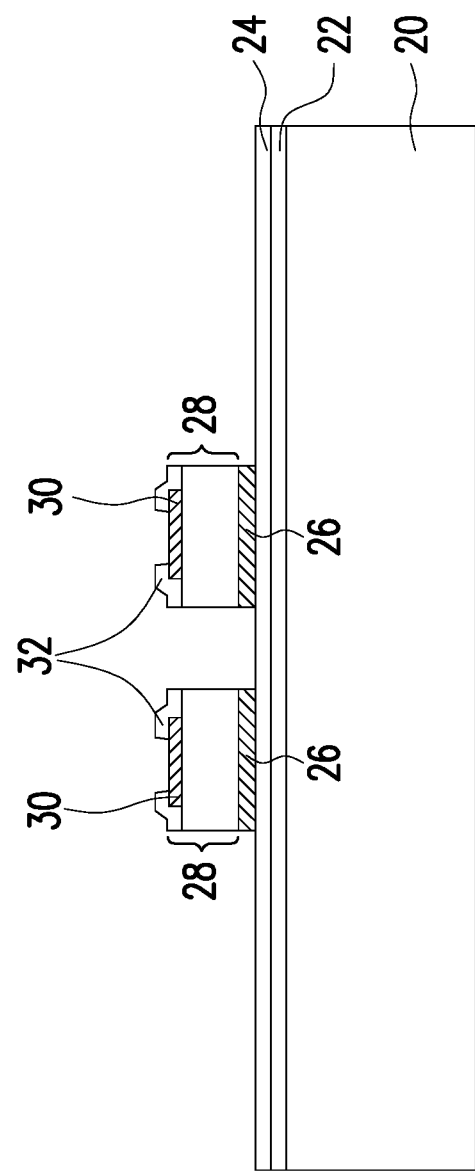
FIGS. 1 through 9 illustrate the cross-sectional views of intermediate stages in the formation of a package including a seal ring penetrating through a molding material in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package and the method of forming the same are provided in accordance with various exemplary embodiments. The intermediate stages of forming the package are illustrated in accordance with some embodiments. Some variations of some embodiments are discussed. Throughout the various views and illustrative embodiments, like reference numbers are used to designate like elements.

Figure 25:
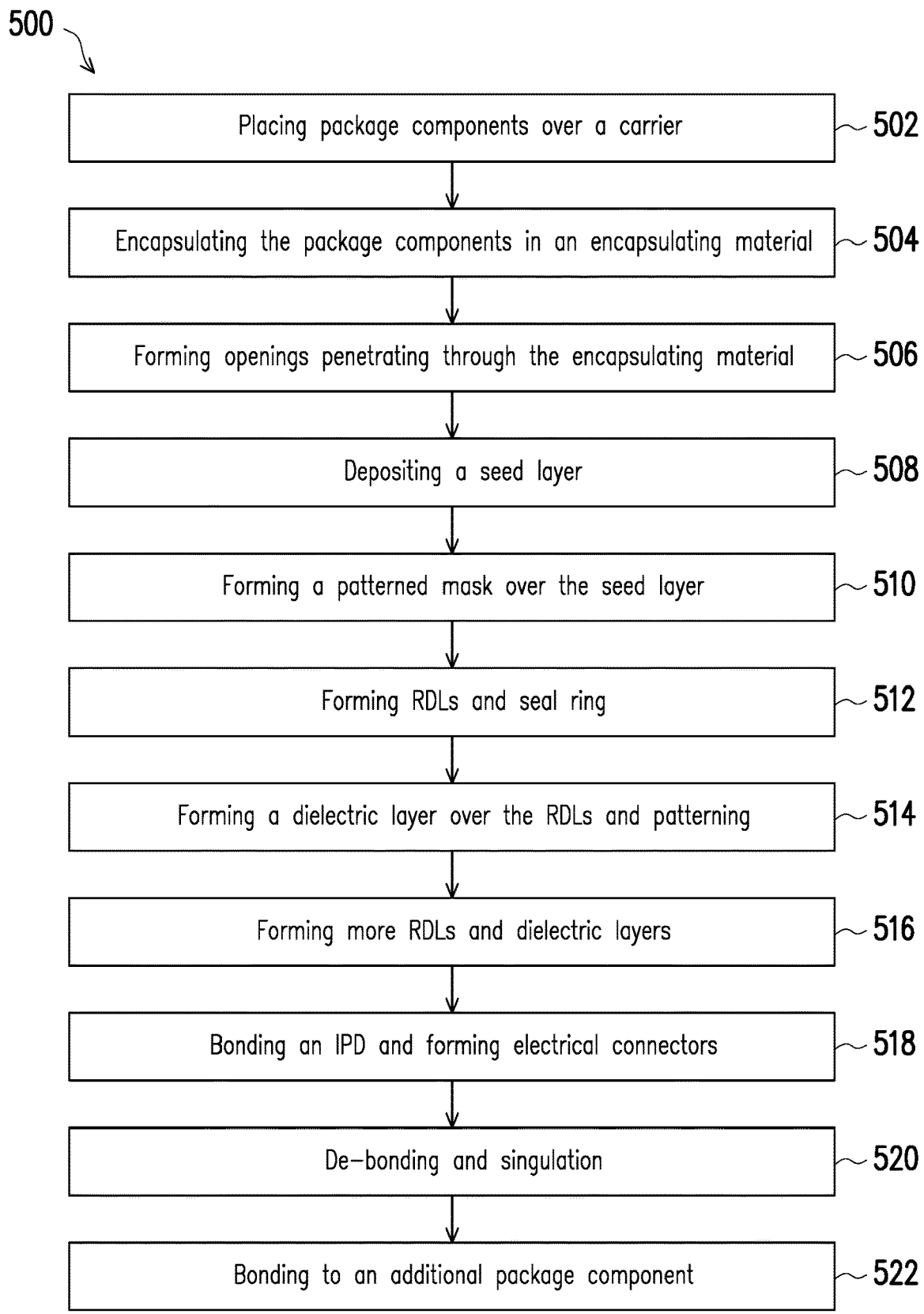
FIGS. 25 and 26 illustrate process flows for forming packages in accordance with some embodiments.

FIGS. 1 through 9 illustrate the cross-sectional views of intermediate stages in the formation of a package in accordance with some embodiments. The steps shown in FIG. 1 through 9 are also illustrated schematically in the process flow 500 as shown in FIG. 25.

FIG. 1 illustrates carrier 20 and release layer 22 coated on carrier 20. Carrier 20 may be a glass carrier, a ceramic carrier, or the like. Carrier 20 may have a round top-view shape, and may have a size of a silicon wafer. For example, carrier 20 may have an 8-inch diameter, a 12-inch diameter, or the like. Release layer 22 may be formed of a Light-To-Heat-Conversion (LTHC) coating, which may be removed along with carrier 20 from the overlying structures that will be formed in subsequent steps. In accordance with some embodiments of the present disclosure, release layer 22 is formed of an epoxy-based thermal-release material. Release layer 22 may be disposed onto carrier 20 through coating and curing.

Dielectric layer 24 (which is sometimes referred to as a base layer for forming the overlying structure or a buffer layer) is formed over release layer 22. The bottom surface of dielectric layer 24 may be in contact with the top surface of release layer 22. In accordance with some embodiments of the present disclosure, dielectric layer 24 is formed of a polymer, which may be a photo-sensitive material such as polybenzoxazole (PBO), polyimide, or the like. In accordance with alternative embodiments, dielectric layer 24 is formed of a non-photo-sensitive material or an inorganic dielectric material, which may be a nitride such as silicon nitride, an oxide such as silicon oxide, Phospho-Silicate glass (PSG), Boro-Silicate Glass (BSG), Boron-Doped Phospho-Silicate Glass (BPSG), or the like.

FIG. 1 also illustrates the placement/attachment of package components 28. The respective step is illustrated as step 502 in the process flow shown in FIG. 25. Package components 28 are attached to dielectric layer 24 through Die-Attach Films (DAFs) 26, which are adhesive films. Each of package components 28 may include a semiconductor substrate (not shown separately) having a back surface (the surface facing down) in physical contact with the respective underlying DAF 26. Package components 28 may include integrated circuit devices (such as active devices, which include transistors, for example, not shown) at the front surface (the surface facing up) of the semiconductor substrate. Package components 28 may include a logic die such as a Central Processing Unit (CPU) die, a Graphic Processing Unit (GPU) die, a mobile application die, a Micro Control Unit (MCU) die, an input-output (IO) die, a BaseBand (BB) die, an Application processor (AP) die, or the like. Package components 28 may also include a memory die such as a Dynamic Random Access Memory (DRAM) die or a Static Random Access Memory (SRAM) die. Package components 28 may also include System on Chip (SoC) dies, memory stacks (such as High-Bandwidth Memory (HBM) cubes), packages, or the like. Package components 28 may be the same as each other or different from each other.

Although two package components 28 are illustrated as an example, there may be one package component 28 or more than two package components per package. It is appreciated that the packaging process may be performed at wafer-level or die-level. When performed at the wafer-level, there is a plurality of identical groups of package components, with each group being illustrated schematically, placed over carrier 20, and the plurality of groups of package components is allocated as an array.

In accordance with some exemplary embodiments, conductive features 30 are pre-formed as portions of package components 28, wherein conductive features 30 are electrically coupled to the integrated circuit devices such as transistors (not shown) in package components 28. Conductive features 30 may be metal pillars (such as copper pillars), metal pads, micro-bumps, or the like. Although one conductive feature 30 is illustrated for each of package components 28 for simplicity, each package component 28 may include a plurality of conductive features 30. Throughout the description, conductive features 30 are referred to as metal pillars, although they may be other types of conductive features.

In accordance with some embodiments of the present disclosure, package components 28 include top dielectric layers 32 filling the gaps between neighboring metal pillars 30. Top dielectric layers 32 may include portions covering at least some portions of the top surfaces of metal pillars 30. In accordance with some embodiments of the present disclosure, top dielectric layers 32 are formed of a polymer, which may be PBO or polyimide. In accordance with some embodiments of the present disclosure, dielectric layers 32 are etched to form openings, through which metal pillars 30 are exposed. In accordance with alternative embodiments of the present disclosure, no openings are formed to expose metal pillars 30 at this time. Rather, metal pillars 30 are revealed at a time after molding material is formed.

Figure 2:
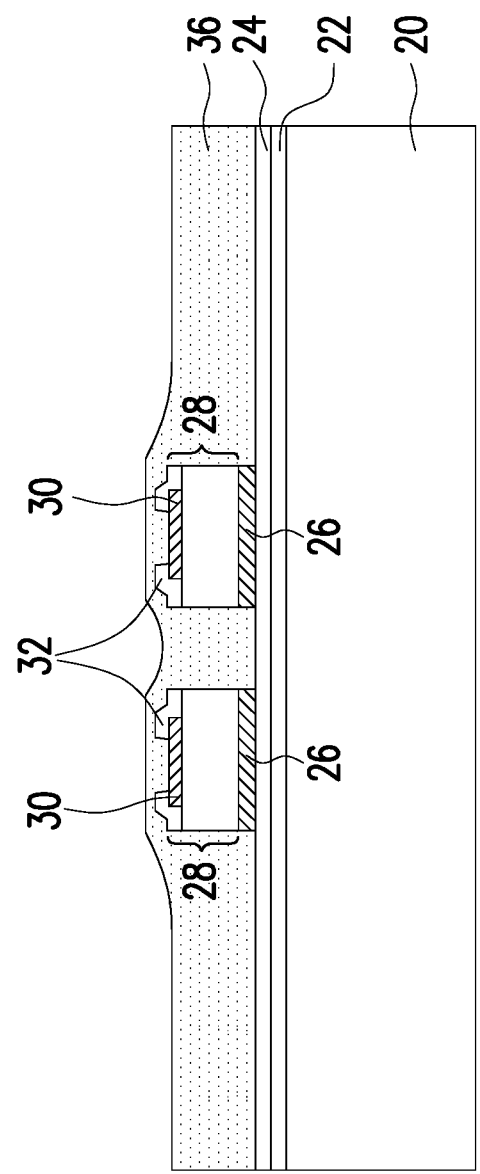

Next, package components 28 are encapsulated by encapsulating material 36, as shown in FIG. 2. The respective step is illustrated as step 504 in the process flow shown in FIG. 25. Encapsulating material 36 fills the gaps between neighboring package components 28. Encapsulating material 36 may be an epoxy (or resin) based material, and may be photo-sensitive. Encapsulating material 36 may be formed of a dry film, which is pre-formed as a film and then laminated on the structure shown in FIG. 1. The laminated film may be pressed at an elevated temperature, for example, in the range between about 25 degrees and about 150 degrees. The dry film may be formed of epoxy (or resin) capped by Polyethylene (PE) or Polyethylene Terephthalate (PET) protecting film on the both side, or the like. In accordance with alternative embodiments, encapsulating material 36 is dispensed in a flowable form, and is then cured (through thermal curing or Ultra-Violet (UV) curing, for example). The top surface of encapsulating material 36 is higher than the top surfaces of package components 28, with package components 28 covered by a thin layer of encapsulating material 36. Furthermore, typical molding materials such as molding compound and underfill may include filler particles such as $SiO_2$, $Al_2O_3$, or silica particles. In accordance with some embodiments of the present disclosure, encapsulating material 36 is free from filler particles, and the entire encapsulating material 36 may be formed of a homogenous material. Making encapsulating material 36 free from filler particles allows the portions of encapsulating material 36 directly over package components 28 to be very thin without sacrificing the isolation ability.

Figure 23:
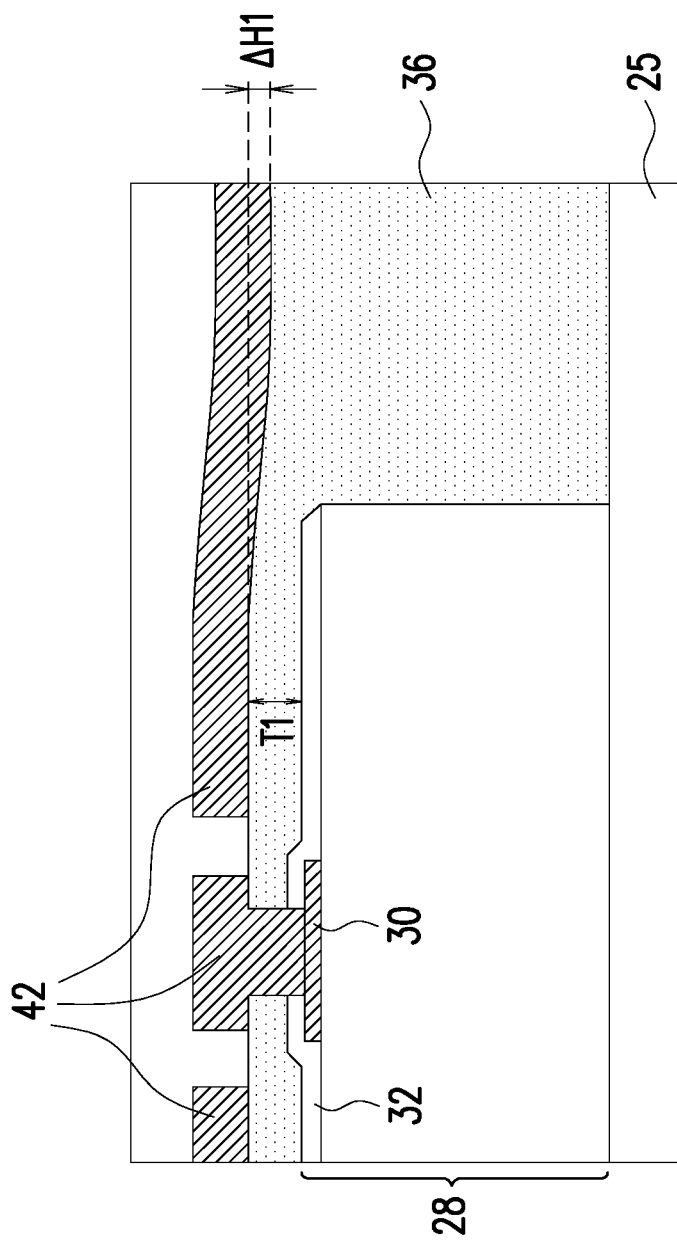

FIG. 23 schematically illustrates a magnified view of a portion of the structure shown in FIG. 2. Due to the height of package components 28, the top surface of encapsulating material 36 may include a first portion directly over package component 28, and a second portion not directly over package component 28. The second portion encircles the first portion. In accordance with some embodiments of the present disclosure, the formation of encapsulating material 36 does not include a planarization process (such as a Chemical Mechanical Polish (CMP) process or a mechanical grinding process). Accordingly, the first portion of the top surface of encapsulating material 36 is higher than the second portion of the top surface of encapsulating material 36, with a smooth transition from the first portion to the second portion. The height difference $\Delta H1$ between the first portion and the second portion may be greater than about 2 µm, and may be in the range between about 4 µm and about 10 µm. In accordance with alternative embodiments of the present disclosure, a planarization process is performed, and hence the top surface of encapsulating material 36 is planar. The portions of encapsulating material 36 directly over package components 28 may also have thickness T1 in the range between about 10 µm and about 30 µm.

Figure 3:
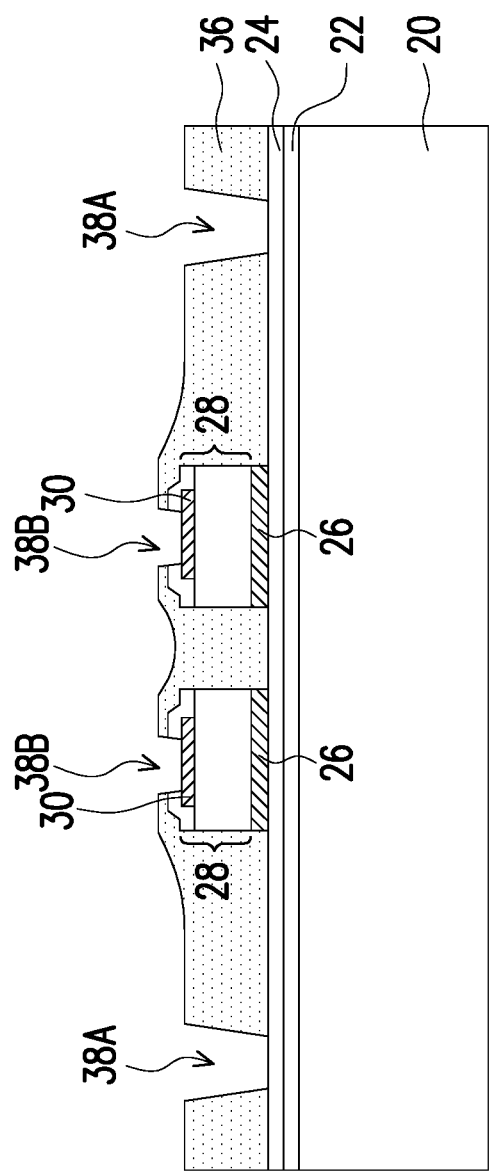

Referring to FIG. 3, openings 38A and 38B are formed in encapsulating material 36. The respective step is illustrated as step 506 in the process flow shown in FIG. 25. In accordance with some embodiments of the present disclosure, openings 38A penetrate through encapsulating material 36, so that dielectric layer 24 is exposed. Openings 38B also penetrate through encapsulating material 36, so that metal pillars 30 are exposed. If metal pillars 30 are still covered by dielectric layer 32 at this time, dielectric layer 32 is patterned, for example, in an etching step (which may be performed using the patterned encapsulating material 36 as the etching mask), until metal pillars 30 are revealed. In accordance with some embodiments of the present disclosure, encapsulating material 36 is formed of a photo-sensitive material, and the patterning of encapsulating material 36 may be achieved through light exposure using a photolithography mask (not shown), which includes opaque portions and transparent portions, and then developing encapsulating material 36 to form openings 38A and 38B. Although openings 38A are illustrated as discrete openings in the cross-sectional view shown in FIG. 3, in a top view of the structure shown in FIG. 3, the illustrated openings 38A may be portions of an opening ring that encircles package components 28. Openings 38B, on the other hand, are discrete openings, with each exposing one of the metal pillars 30.

Figure 4:
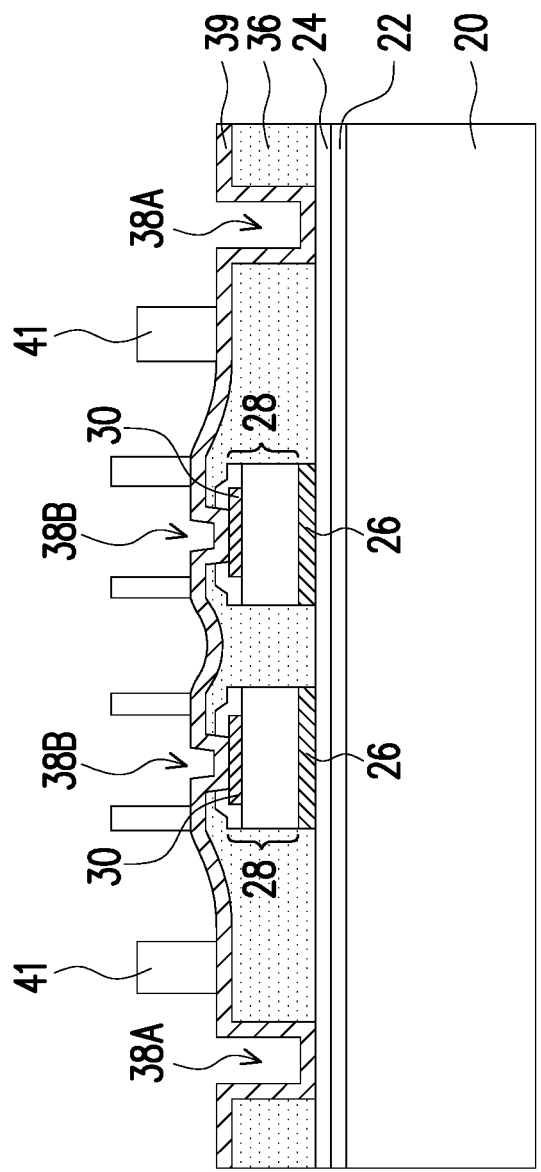
Figure 5:
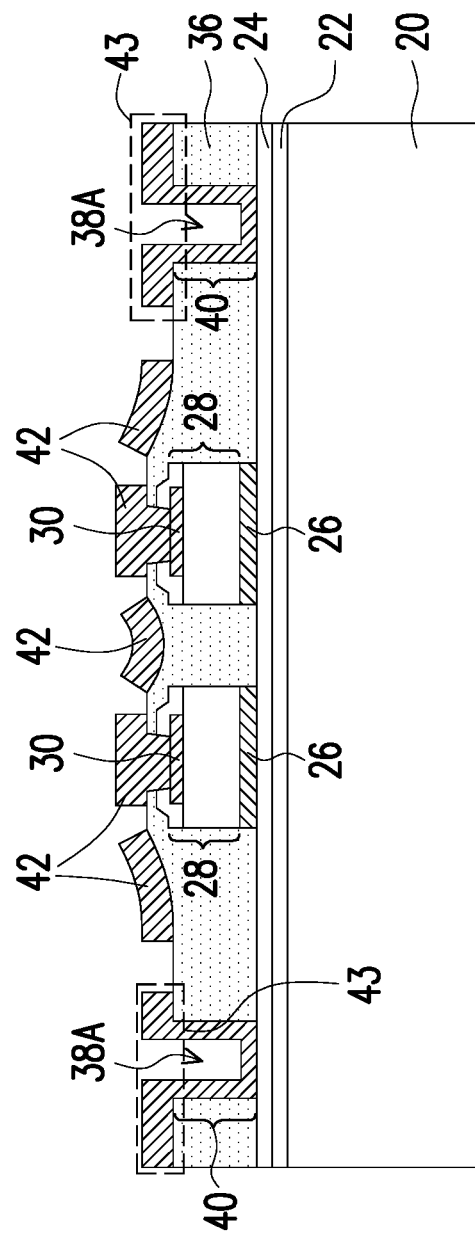

FIGS. 4 and 5 illustrate the formation of seal ring 40 and Redistribution Lines (RDLs) 42. The respective step is illustrated as step 512 in the process flow shown in FIG. 25. Referring to FIG. 4, metal seed layer 39 is deposited. The respective step is illustrated as step 508 in the process flow shown in FIG. 25. In accordance with some embodiments of the present disclosure, metal seed layer 39 includes a titanium layer and a copper layer over the titanium layer. In accordance with alternative embodiments of the present disclosure, metal seed layer 39 includes a copper layer physically contacting encapsulating material 36. Metal seed layer 39 is a conformal or substantially conformal film (for example, with thickness variation smaller than about 15 percent). The formation of metal seed layer 39 may include Physical Vapor Deposition (PVD), for example.

Patterned mask 41 is formed over seed layer 39. The respective step is illustrated as step 510 in the process flow shown in FIG. 25. In accordance with some embodiments of the present disclosure, the formation of patterned mask 41 includes dispensing and patterning a photo resist. Next, a plating process may be performed, and a metallic material such as copper or copper alloy is plated. After the plating process, patterned mask 41 is removed, and a flash etch is performed to remove the portions of seed layer 39 that were previously directly under patterned mask 41. The resulting structure is shown in FIG. 5.

The remaining portions of the plated metallic material and the remaining portions of seed layer 39 are in combination referred to as RDLs 42 and seal ring 40. RDLs 42 are over encapsulating material 36. Seal ring 40 penetrates through encapsulating material 36, and may extend from a first level higher the top surfaces of package components 28 to a second level lower than or level with the bottom surfaces of package components 28. Furthermore, seal ring extension portions 43 are formed over encapsulating material 36.

Figure 24:
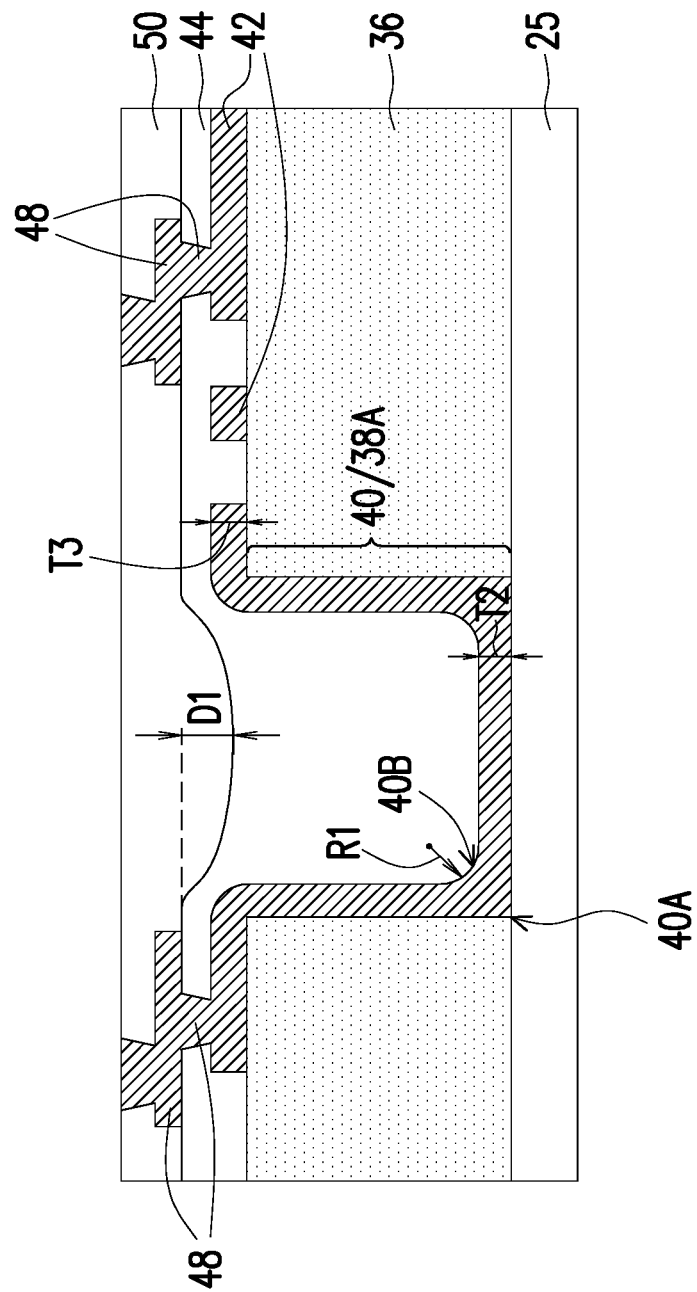

FIG. 24 illustrates a magnified view of a portion of the structure shown in FIG. 5. Seal ring 40 (which is in opening 38A as in FIG. 3) includes a bottom portion at the bottom of opening 38A, and the bottom portion has thickness T2. RDLs 42 include horizontal portions over encapsulating material 36 and having thickness T3. The deposited metallic material is conformal, and hence thickness T2 is close to thickness T3. For example, thickness T2 may be between about 85 percent and 95 percent of thickness T3. Also, seal ring 40 includes an outer bottom corner 40A and an inner bottom corner 40B. The outer bottom corner may be a sharp corner with no significant roundness, while the inner corner 40B may be rounded, for example, with radius R1 greater than about 50 percent of thickness T2, and ratio R1/T2 may be in the range between about 0.5 and about 1.5.

Referring back to FIG. 5, RDLs 42 include metal trace portions over encapsulating material 36 and via portions extending into openings 38B (FIG. 3), so that RDLs 42 are electrically connected to conductive features 30. Although not illustrated, the portions of RDLs 42 directly over openings 38B may have recesses due to the conformal profile of RDLs 42.

Figure 6:
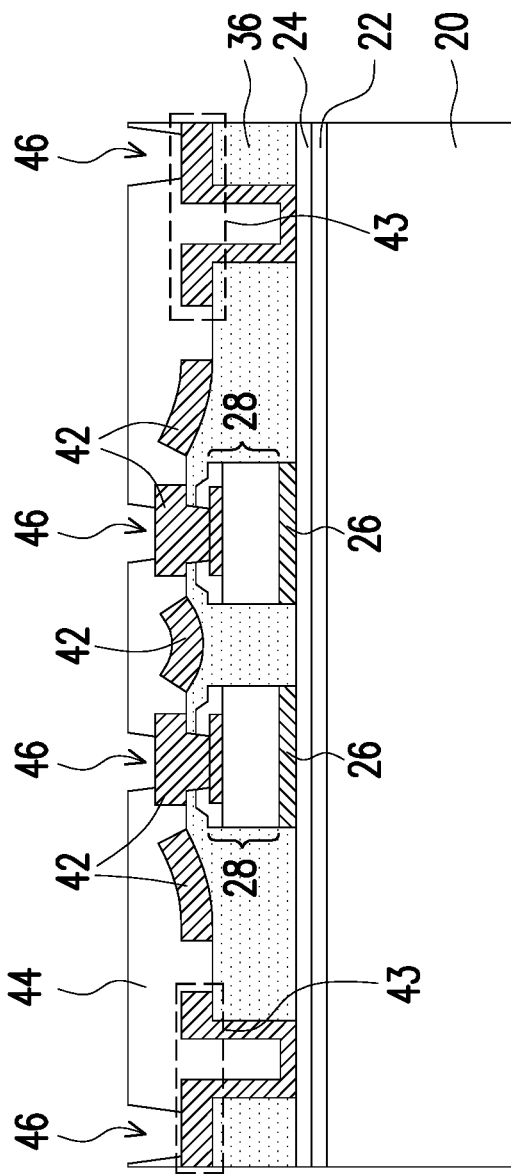

Referring to FIG. 6, dielectric layer 44 is formed. The respective step is illustrated as step 514 in the process flow shown in FIG. 25. In accordance with some embodiments of the present disclosure, dielectric layer 44 is formed of a polymer such as PBO, polyimide, or the like. In accordance with alternative embodiments, dielectric layer 44 is formed of an inorganic material such as silicon nitride, silicon oxide, or the like. Openings 46 are then formed, for example, through a photo lithography process. Seal ring extension portions 43 and RDLs 42 are exposed to openings 46.

FIG. 24 also illustrates a magnified view of a portion of dielectric layer 44. Due to the openings 38A as shown in FIG. 5, the top surface of dielectric layer 44 (FIG. 24) has a recess directly over seal ring 40. The recess is directly over a portion of dielectric layer 44 extending between opposite sidewall portions of seal ring 40, which sidewall portions are on opposite sidewalls of the respective opening 38A. The recess depth D1 may be greater than about 30 percent of thickness T3, and may be in the range between about 30 percent and about 50 percent of thickness T3.

Figure 7:
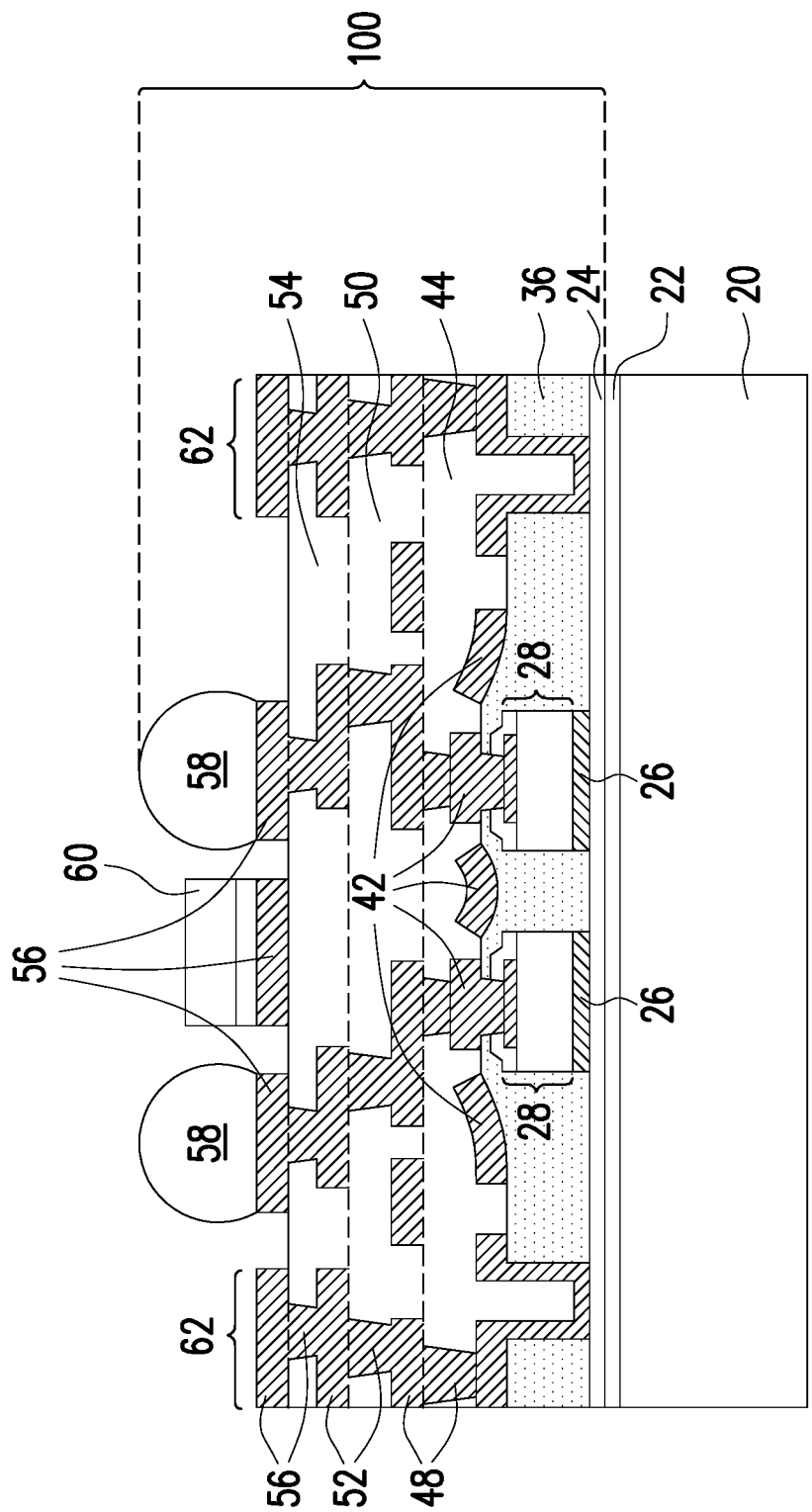

Referring to FIG. 7, more features are formed over dielectric layer 44, which features include dielectric layers 50 and 54 and RDLs 48, 52, and 56. The respective step is illustrated as step 516 in the process flow shown in FIG. 25. In accordance with some embodiments of the present disclosure, the formation of RDLs 48 includes depositing a metal seed layer (not shown), forming and patterning a photo resist (not shown) over the metal seed layer, and plating a metallic material such as copper or aluminum over the metal seed layer. The metal seed layer and the plated material may be formed of the same material or different materials. The patterned photo resist is then removed, followed by etching the portions of the seed layer previously covered by the patterned photo resist. The materials and the formation processes of RDLs 52 and 56 may be similar to that of RDLs 48. The materials and the formation processes of dielectric layers 50 and 54 may be similar to that of dielectric layer 44. The details are thus not repeated herein.

Integrated Passive Device (IPD) 60 may be bonded to RDLs 56, and electrical connectors 58 are formed in accordance with some exemplary embodiments. The respective step is illustrated as step 518 in the process flow shown in FIG. 25. In accordance with some embodiments of the present disclosure, Under-Bump Metallurgies (UBMs) are not formed, and electrical connectors 58 are formed directly on RDLs 56. This may be achieved when the respective package is a low-cost package, and hence some features (such as UBMs and the through-vias penetrating through encapsulating material 36) are skipped to reduce manufacturing cost. In accordance with alternative embodiments of the present disclosure, UBMs (not shown) are formed between RDLs 56 and electrical connectors 58.

The formation of electrical connectors 58 may include placing solder balls on the exposed portions of RDLs 56, and then reflowing the solder balls. In accordance with alternative embodiments of the present disclosure, the formation of electrical connectors 58 includes performing a plating process to form solder layers over RDLs 56, and then reflowing the solder layers. Electrical connectors 58 may also include metal pillars, or metal pillars and solder caps on the metal pillars, which may also be formed through plating. Throughout the description, the structure including dielectric layer 24 and the overlying structure in combination is referred to as package 100, which may be a composite wafer (and also referred to as composite wafer 100 hereinafter) including a plurality of package components 28.

Figure 8:
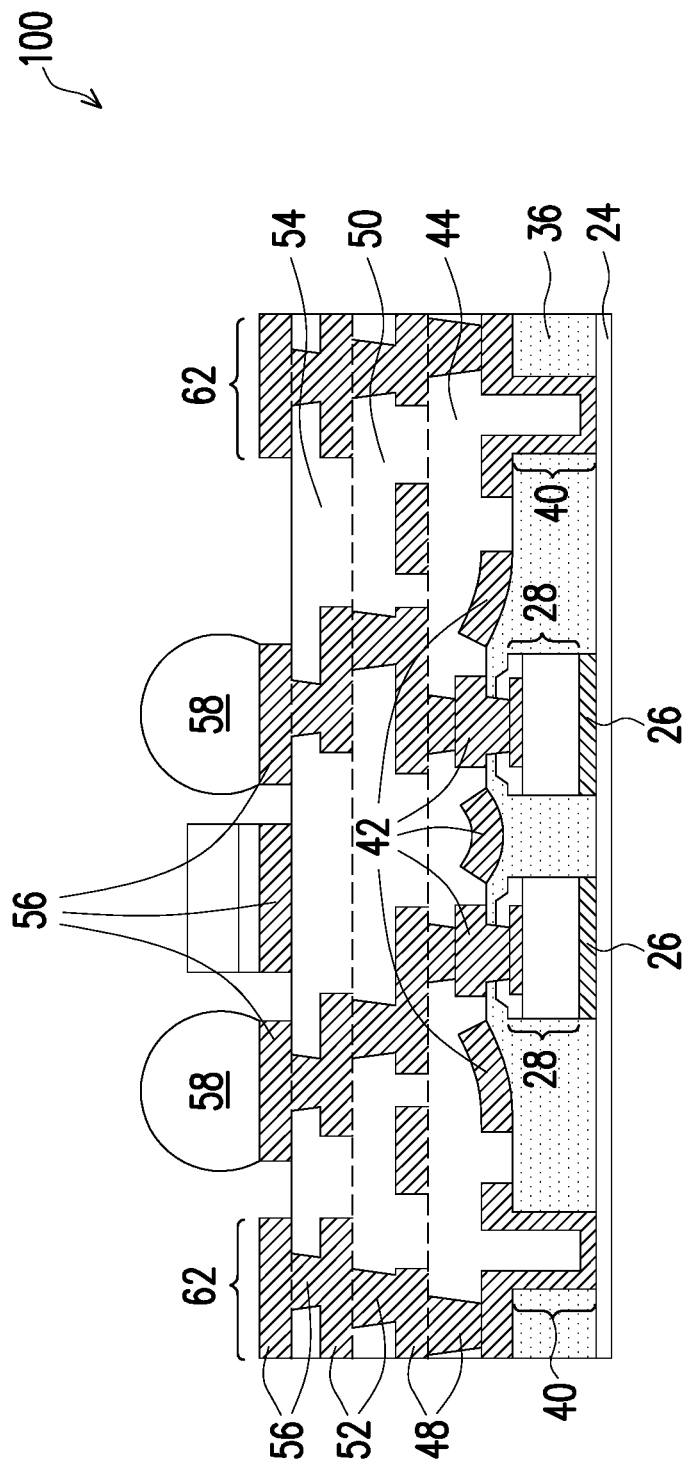
Figure 9:
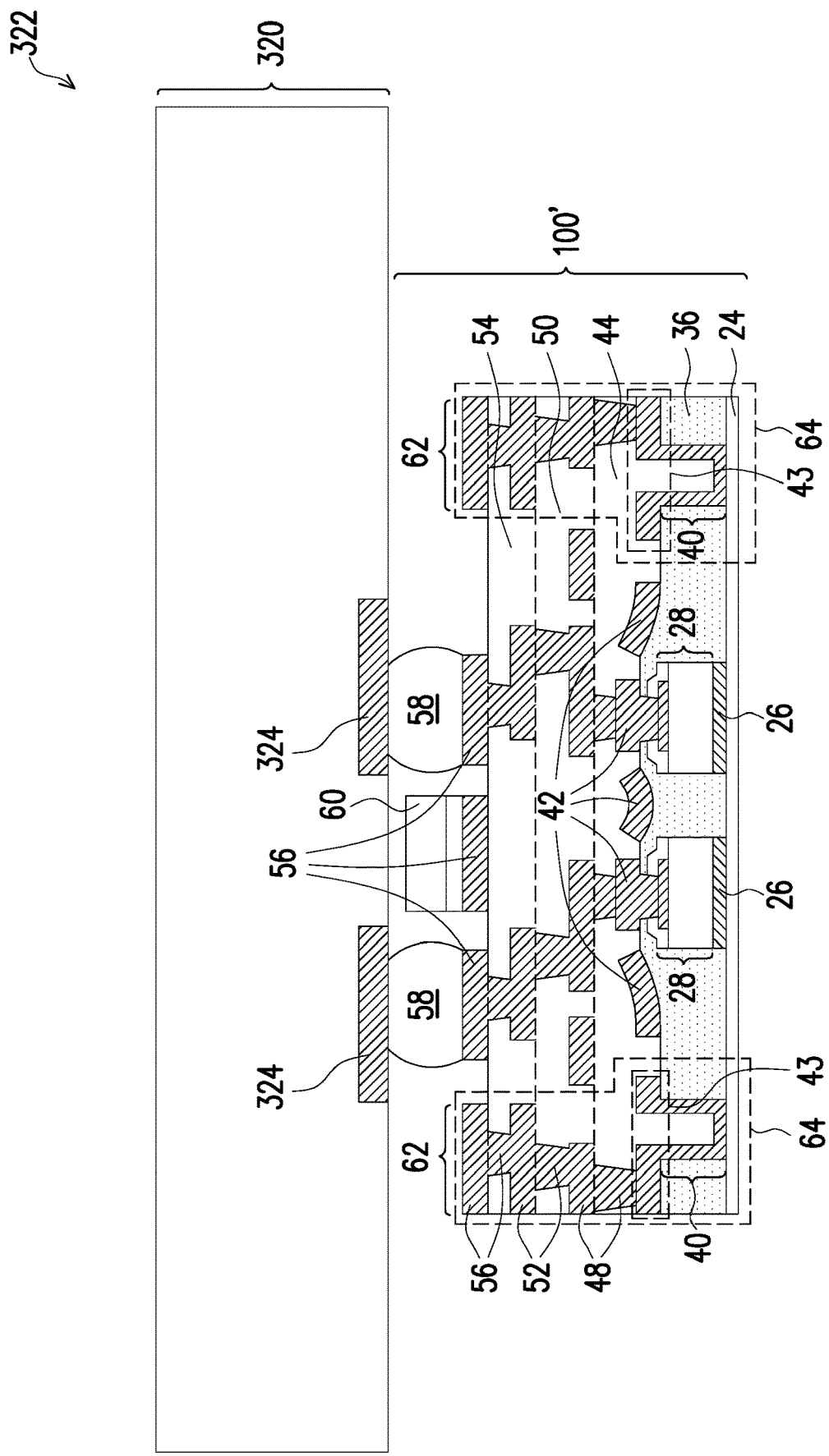

Next, package 100 is de-bonded from carrier 20, for example, by projecting a UV light or a laser beam on release layer 22, so that release layer 22 decomposes under the heat of the UV light or the laser beam. The respective step is illustrated as step 520 in the process flow shown in FIG. 25. The resulting package 100 is shown in FIG. 8. In accordance with some embodiments of the present disclosure, in the resultant package 100, dielectric layer 24 remains as a bottom part of package 100, and protects seal ring 40. Next, a singulation (die-saw) process is performed to separate composite wafer 100 into individual packages 100' (FIG. 9). The respective step is also illustrated as step 520 in the process flow shown in FIG. 25.

FIG. 9 also illustrates the bonding of package component 320 to package 100', thus forming package 322. The respective step is illustrated as step 522 in the process flow shown in FIG. 25. The bonding is performed through solder regions 58, which join RDLs 56 to metal pads 324 in package component 320. In accordance with some embodiments of the present disclosure, package component 320 includes a package substrate, an interposer, a printed circuit board, or the like.

In package 322, some portions of RDLs 48, 52, and 56 form seal ring 62 in dielectric layers 44, 50, and 54, with each of the corresponding parts of RDLs 48, 52, and 56 forming a full ring proximal the peripheral of package 100'. Seal ring 62 is connected to the seal ring extension portions 43 (which also forms a full ring) and seal ring 40 to form seal ring 64. Seal ring 64 thus extends all the way from the top surface of dielectric layer 54, which is the top dielectric layer in package 100', to the bottom surface of encapsulating material 36. Accordingly, package components 28 are also protected from detrimental substance such as moisture and chemicals that may penetrate through encapsulating material 36 to degrade package components 28.

In package 322, encapsulating material 36 includes a first portion at the same level as package components 28, and a second portion higher than package components 28. The first portion and the second portion are the portions of an integrated and continuous material, with no distinguishable interface therebetween. Furthermore, there is no grinding mark in the top surface of encapsulating material 36 since the first portion and the second portion are formed in a same process, and no planarization is performed between the formation of the first portion and the second portion.

Figure 26:
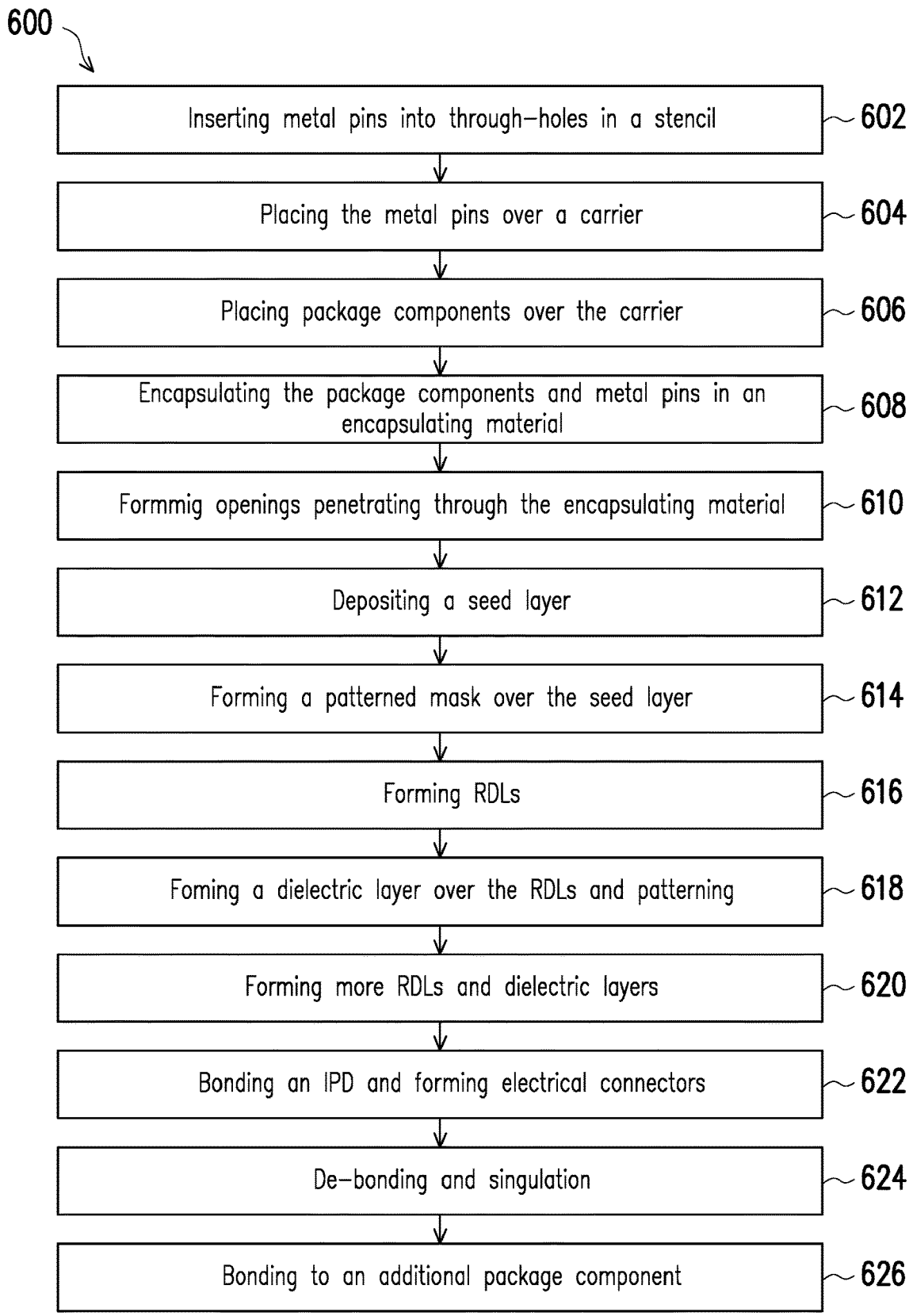

FIGS. 10 through 21 illustrate the perspective views and cross-sectional views of intermediate stages in the formation of a package in accordance with some embodiments of the present disclosure. These embodiments are similar to the embodiments shown in FIGS. 1 through 9, except no seal ring is formed in the encapsulating material. Rather, metal pins are placed in the encapsulating material. Unless specified otherwise, the materials and the formation methods of the components in these embodiments are essentially the same as the like components, which are denoted by like reference numerals in the embodiments shown in FIGS. 1 through 9. The details regarding the formation processes and the materials of the components shown in FIGS. 10 through 21 may thus be found in the discussion of the embodiments shown in FIGS. 1 through 9. The steps shown in FIG. 10 through 21 are also illustrated schematically in process flow 600 as shown in FIG. 26.

Figure 10:
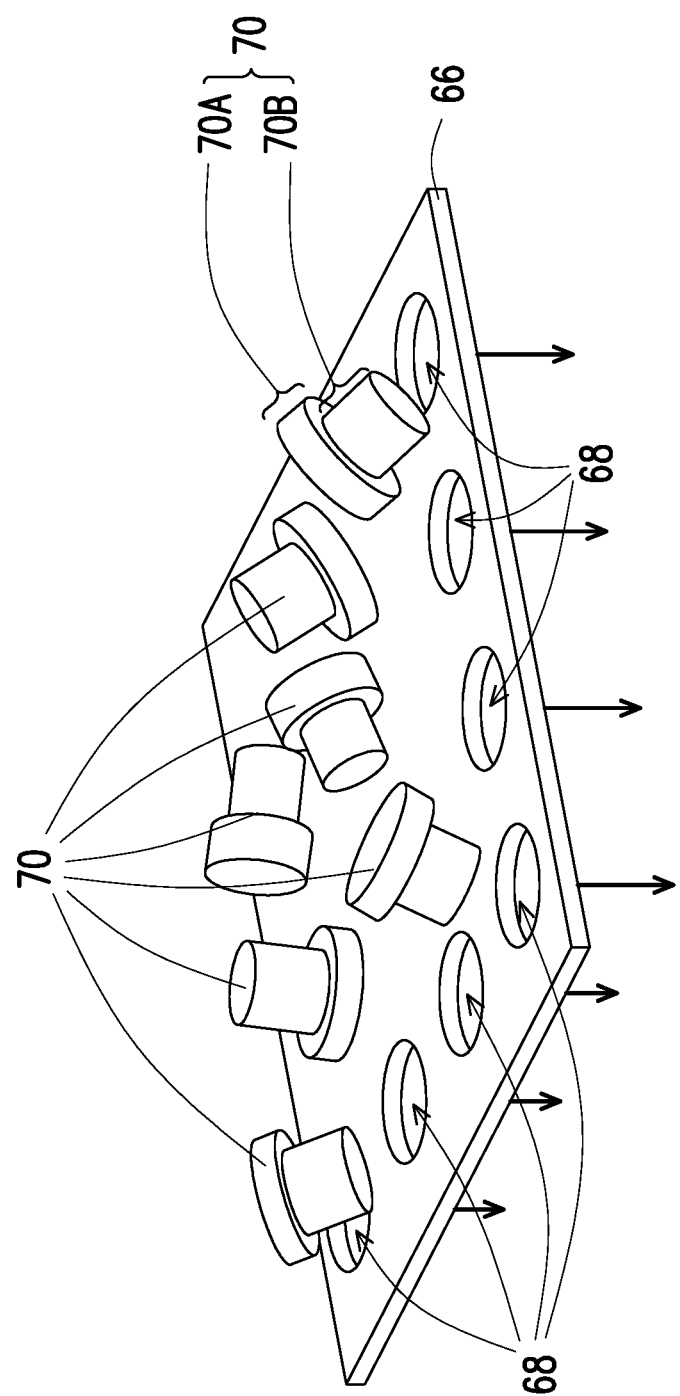
FIGS. 10 through 21 illustrate the perspective views and cross-sectional views of intermediate stages in the formation of a package including metal pins penetrating through a molding material in accordance with some embodiments.

Referring to FIG. 10, stencil 66 is provided. Stencil 66 may be formed of a rigid material such as a metal (stainless steel, copper, aluminum, or the like). Through-holes 68 are formed in stencil 66. The stencil 66 may be attached to a vacuum head (not shown), which is configured to evacuate air in the direction shown by arrows. Metal pins 70 include pin heads 70A and pin tails 70B. It is appreciated that pin heads 70A, pin tails 70B, and through-holes 68 may have circuit shapes or other shapes including, and not limited to, squares, hexagons, or the like. Pin heads 70A have a diameter (or a lateral dimension) greater than the diameter of through-holes 68, and pin tails 70B have a diameter (or lateral dimension) smaller than the diameter of through-holes 68. Accordingly, when pin tails 70B are inserted into through-holes 68, pin heads 70A are blocked. Referring to FIG. 11B, in accordance with some embodiments of the present disclosure, diameter Dia1 of pin head 70A is in the range between about 200 μm and about 250 μm, diameter Dia2 of pin tail 70B is in the range between about 150 μm and about 200 μm, and diameter Dia3 of through-hole 68 is in the range between about 180 μm and about 230 μm. The total height H1 of metal pins 70 may be in the range between about 200 μm and about 250 μm.

Figure 11A:
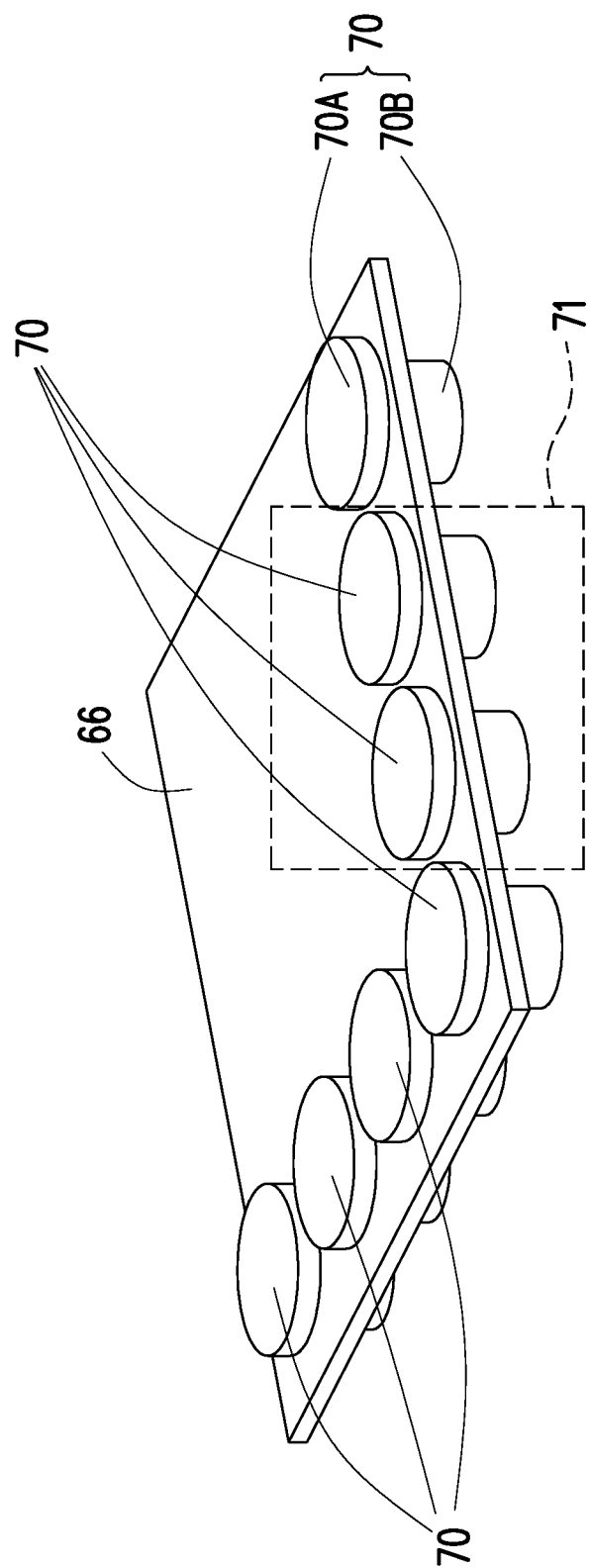
Figure 11B:
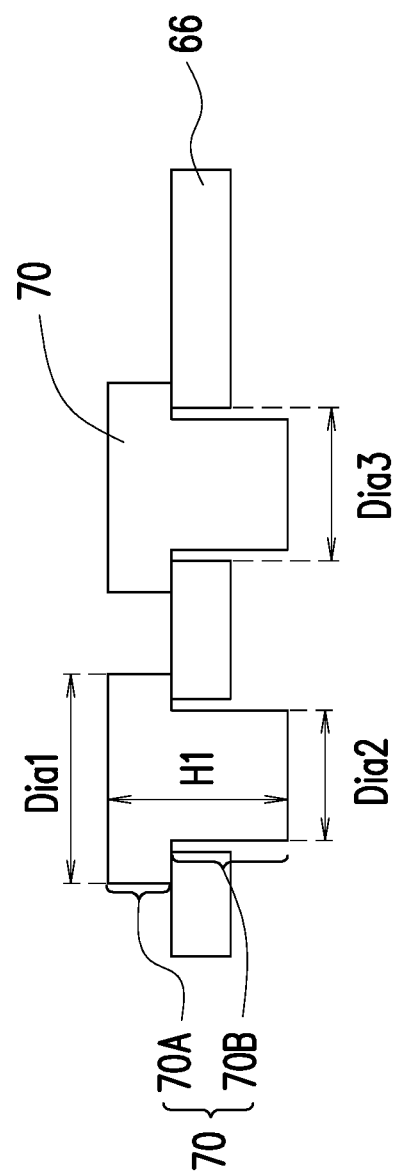

Referring to FIG. 11A, metal pins 70 are inserted into through-holes 68. The respective step is illustrated as step 602 in the process flow shown in FIG. 26. The insertion may be achieved, for example, through picking-and-placing. In accordance with alternative embodiments, metal pins 70 are inserted by pouring metal pins 70 over stencil 66, and vibrating stencil 66, so that tails 70B fall into through-holes 68. After pin tails 70B are inserted into through-holes 68, vacuuming is provided, causing metal pins 70 to be secured onto stencil 66 by the vacuum. FIG. 11B illustrates a cross-sectional view of portion 71 in FIG. 11A.

Figure 12:
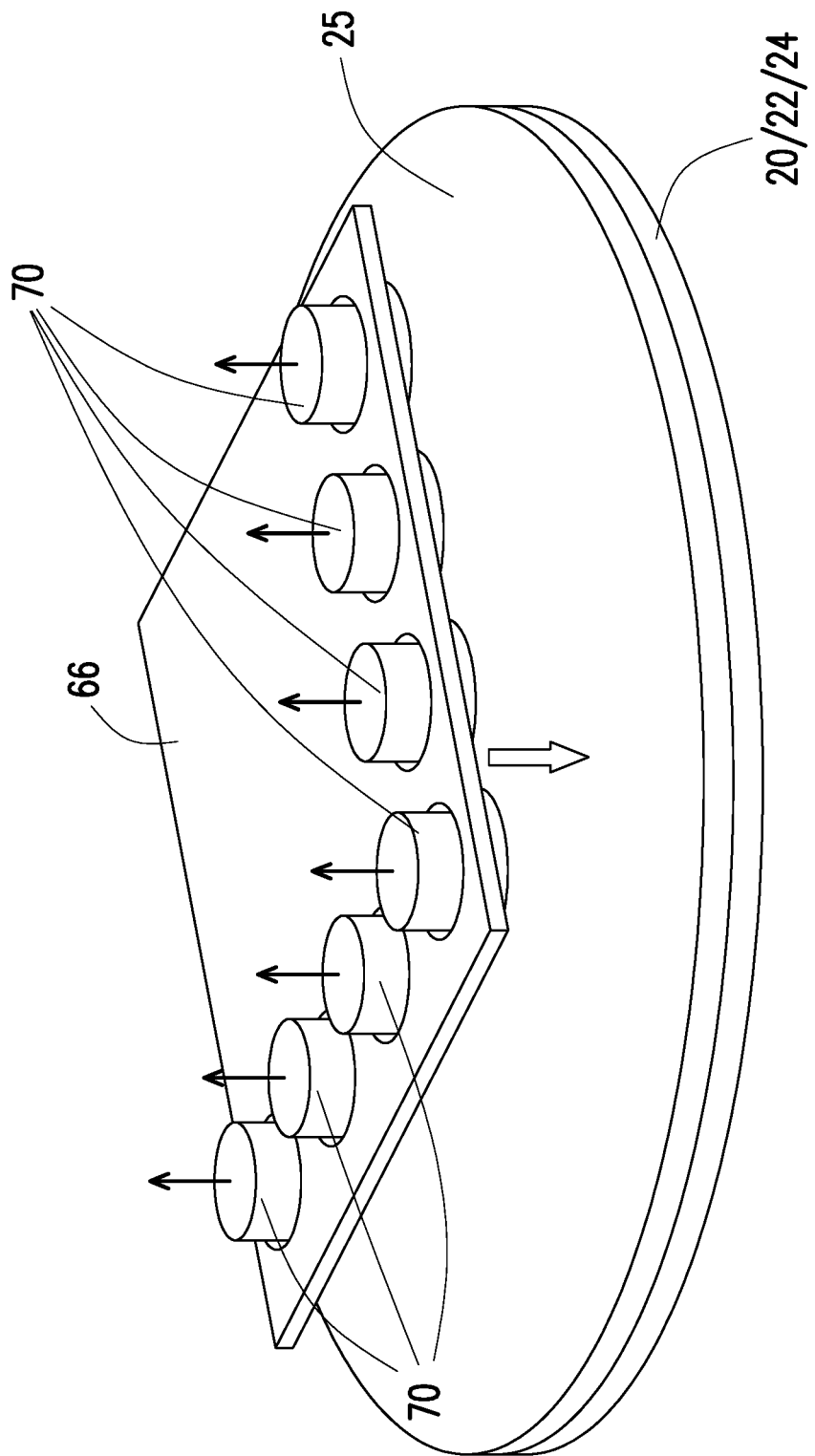

Referring to FIG. 12, stencil 66 is flipped upside down along with metal pins 70 fixed thereon. Metal pins 70 are then moved to DAF 25. The vacuum causes metal pins 70 to hold on stencil 66. In accordance with some embodiments of the present disclosure, as shown in FIG. 12, DAF 25 is adhered to dielectric layer 24, which is further formed on release film 22. Release film 22 is coated on carrier 20. Carrier 20, release film 22, dielectric layer 24, and DAF 25 may have a round top-view shape, on which a plurality of identical packages may be formed.

Figure 13A:
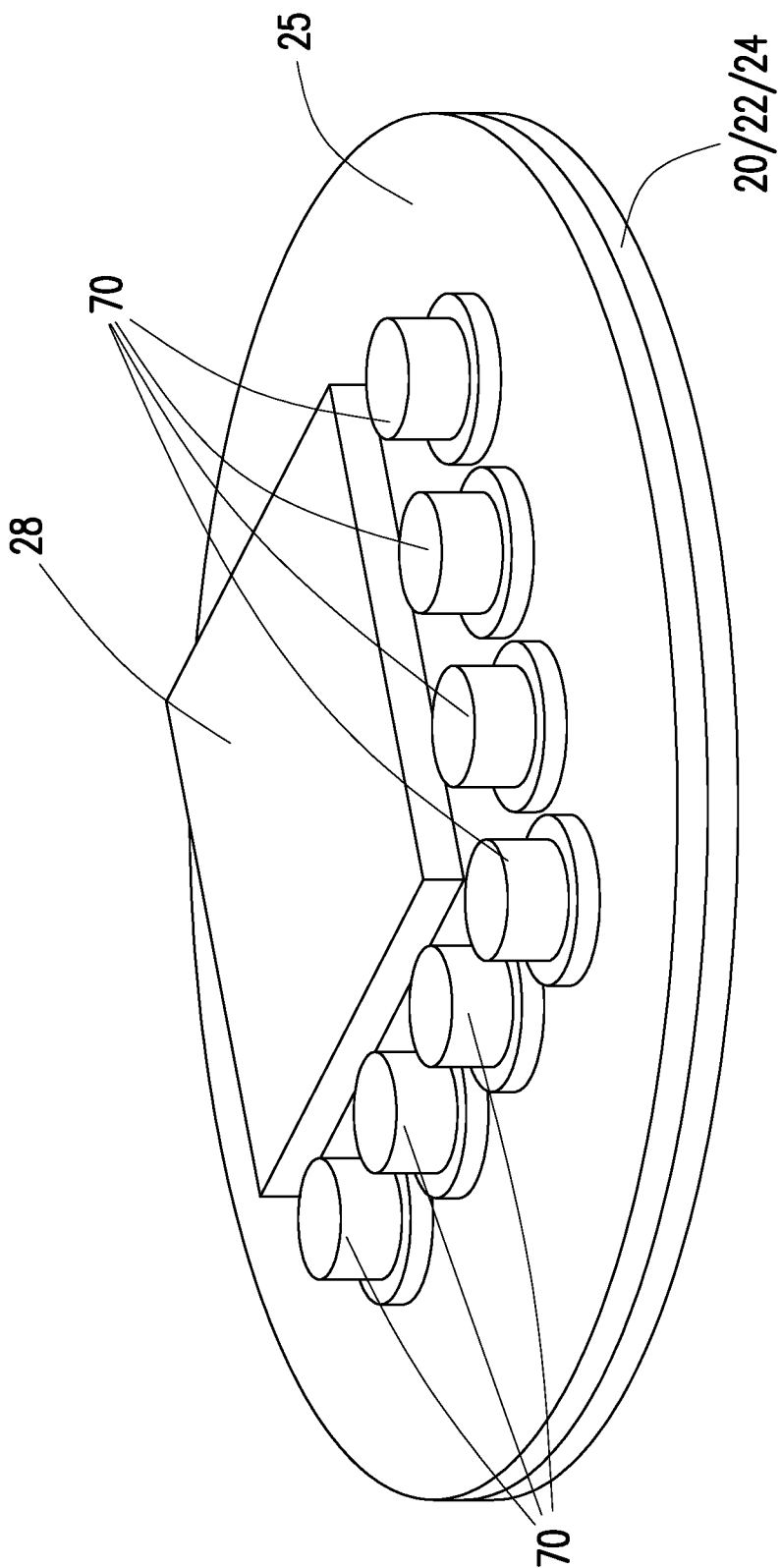
Figure 13B:
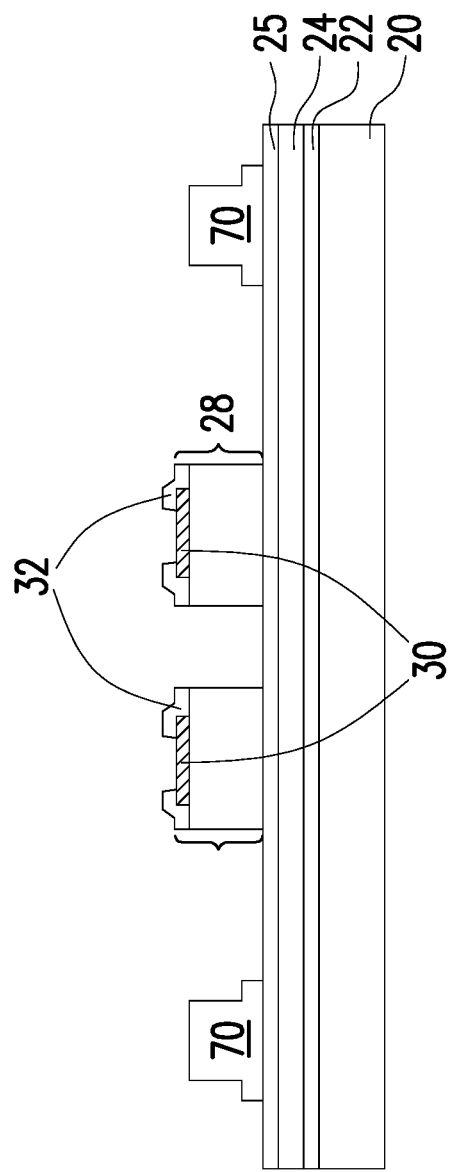

Metal pins 70 are pressed against, and are adhered to, DAF 25. The respective step is illustrated as step 604 in the process flow shown in FIG. 26. Next, the vacuum is released, and stencil 66 is moved away. In a subsequent step, package components 28 are adhered to DAF 25, as shown in FIG. 13A. The respective step is illustrated as step 606 in the process flow shown in FIG. 26. FIG. 13A illustrates a single package component 28, while in reality, a plurality of package components 28 and a plurality of metal pins 70 may be placed on DAF 25 to form a plurality of identical groups, with each of the groups including one or more package component 28 and a plurality of metal pins 70. In accordance with some embodiments of the present disclosure, metal pins 70 and package components 28 have similar heights, for example, with a height difference smaller than about 20 percent the height of metal pins 70. FIG. 13B illustrates a cross-sectional view of the structure shown in FIG. 13A.

Figure 14A:
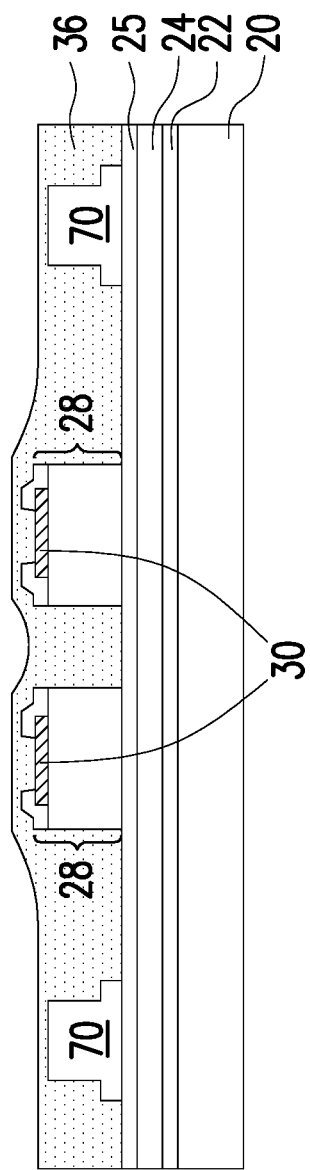
Figure 14B:
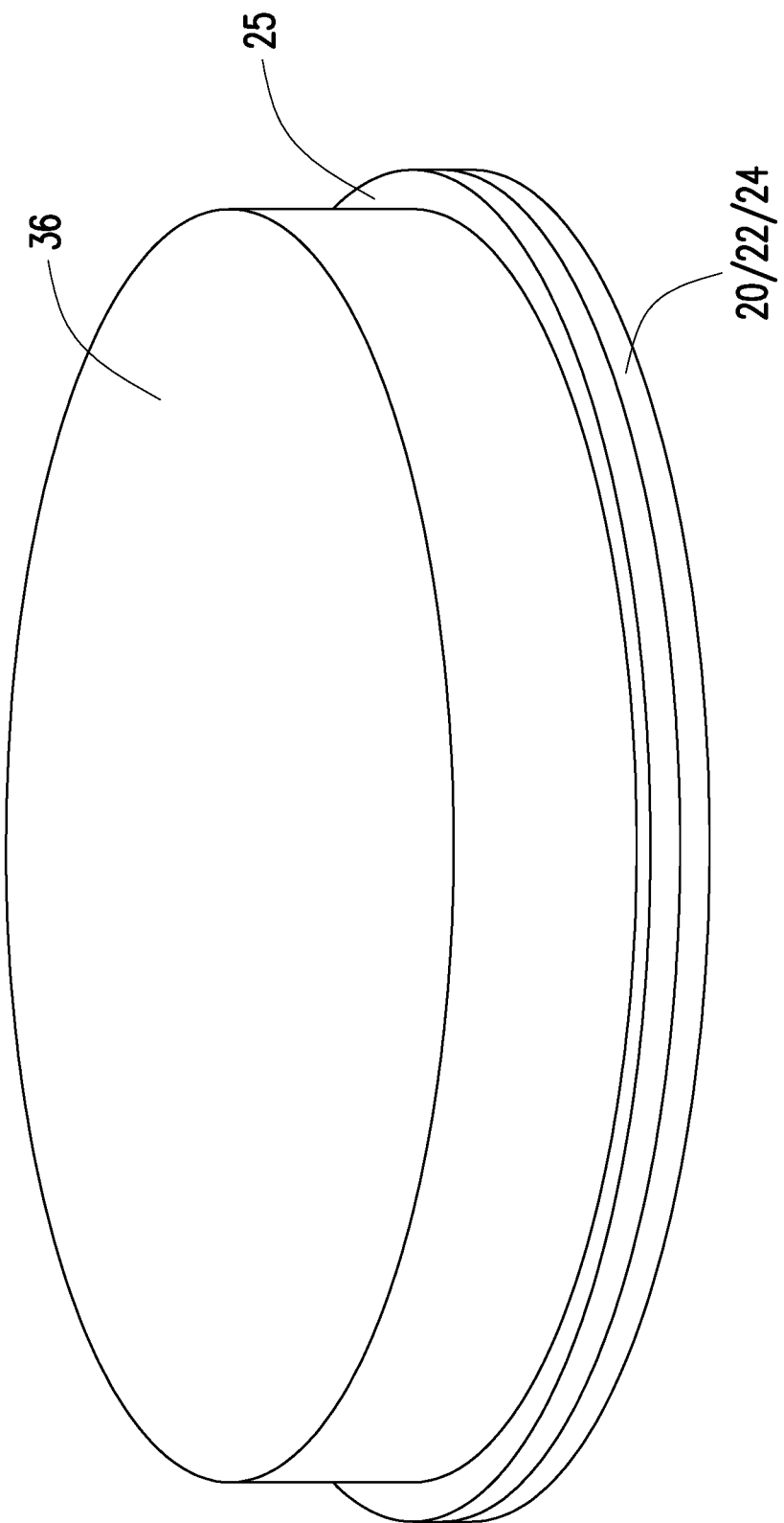

Next, referring to FIG. 14A, encapsulating material 36 is dispensed to cover package components 28 and metal pins 70. The respective step is illustrated as step 608 in the process flow shown in FIG. 26. The material and the method of dispensing encapsulating material 36 may be similar to what are discussed referring to FIG. 2, and hence are not repeated herein. FIG. 14B illustrates a perspective view of the structure shown in FIG. 14A.

Figure 15A:
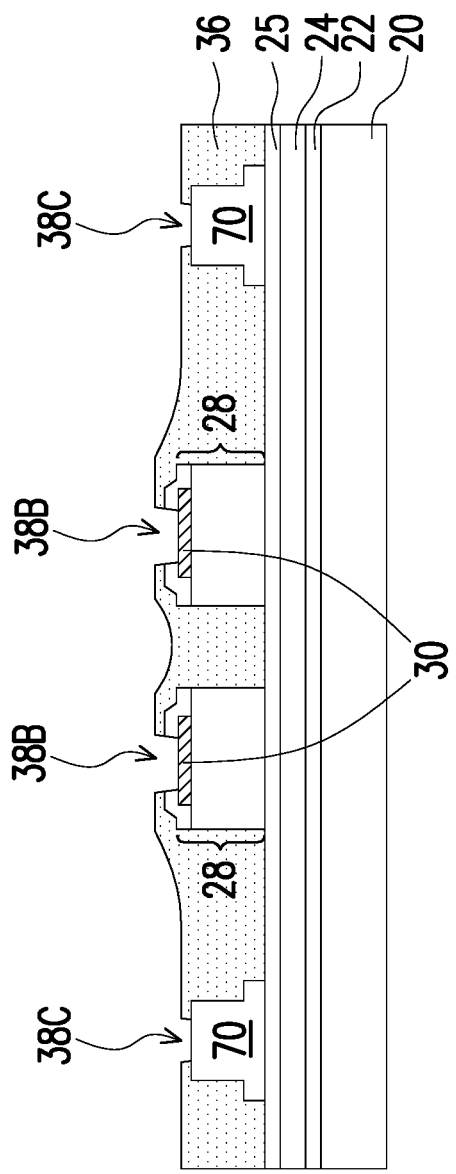
Figure 15B:
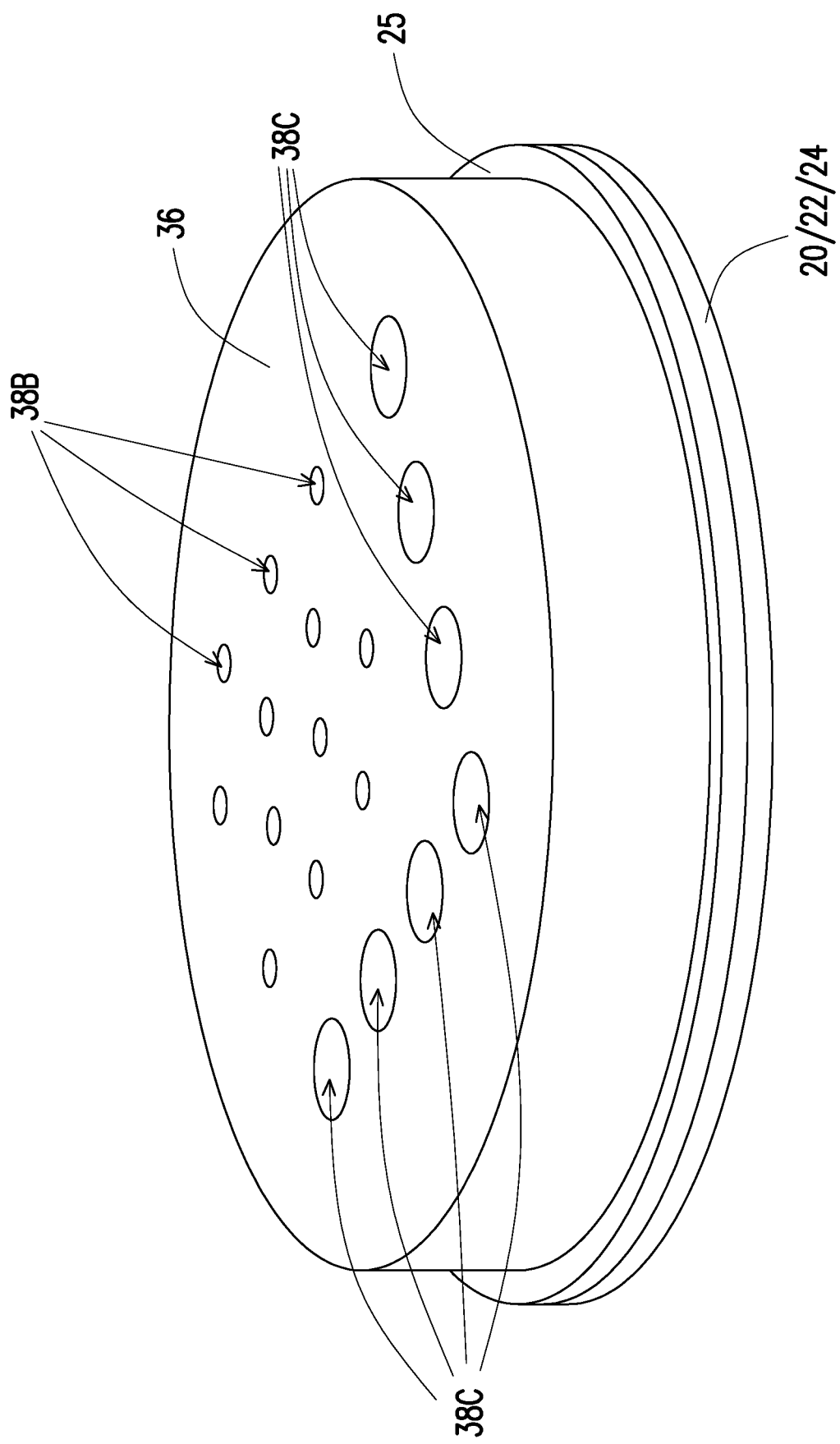

FIGS. 15A and 15B illustrate a cross-sectional view and a perspective view, respectively, in the formation of openings 38B and 38C, through which conductive features 30 and metal pins 70 are exposed. The respective step is illustrated as step 610 in the process flow shown in FIG. 26. Encapsulating material 36 may be formed of a light-sensitive material, and hence openings 38B and 38C may be formed through light-exposure (using a photo lithography mask) and a development process.

Figure 22:
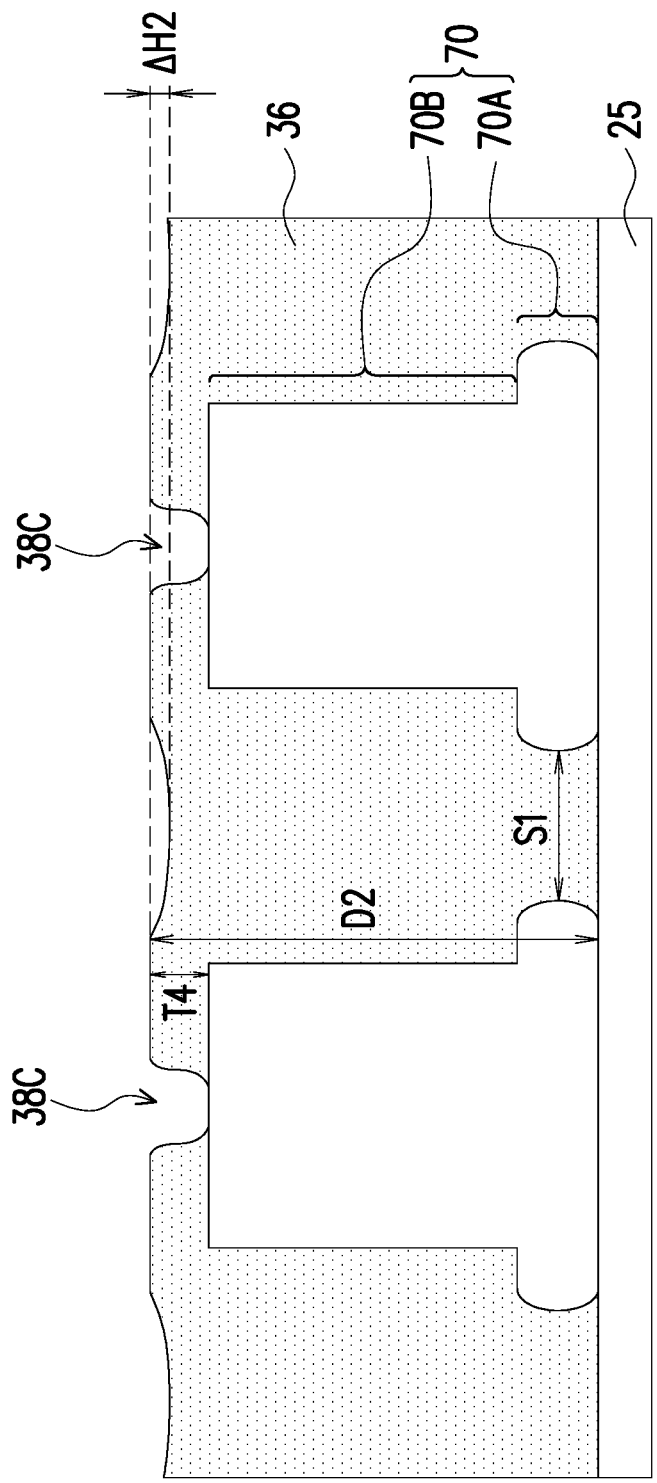
FIGS. 22 through 24 illustrate the magnified views of some portions of packages in accordance with some embodiments.

FIG. 22 illustrates a magnified view of a portion of the structure shown in FIGS. 15A and 15B. Due to the height of metal pins 70, the top surface of encapsulating material 36 includes a first portion directly over metal pin 70, and a second portion encircling metal pins 70. In accordance with some embodiments of the present disclosure, the formation of encapsulating material 36 does not include a planarization process (such as a CMP process or a mechanical grinding process). Accordingly, the top surface of the first portion of encapsulating material 36 is higher than the top surface of the second portion of encapsulating material 36, with a smooth transition from the top surface of the first portion to the top surface of the second portion. The height difference ΔH2 between the top surfaces of the first portion and the second portion is greater than about 2 μm, and may be in the range between about 4 μm and about 5 μm. In accordance with alternative embodiments of the present disclosure, a planarization process is performed, and hence the top surface of encapsulating material is planar. The first portion of encapsulating material 36 directly over metal pin 70 may also have thickness T4 in the range between about 10 μm and about 30 μm. The spacing S1 between neighboring metal pins 70 may be in the range between about 100 μm and about 150 μm. The depth/thickness D2 of encapsulating material 36 may be in the range between about 160 μm and about 250 μm in accordance with some exemplary embodiments.

Figure 16:
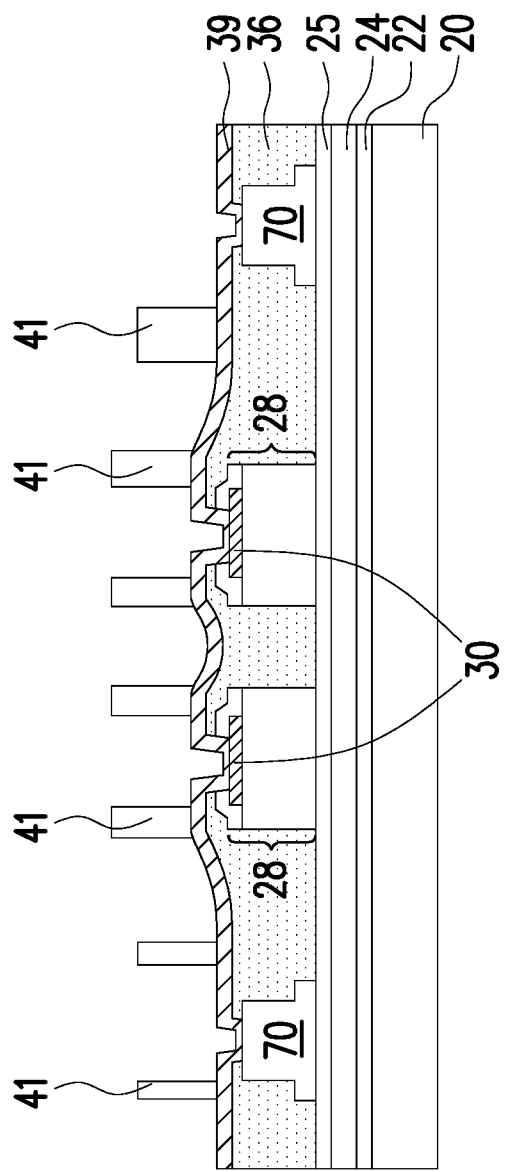
Figure 17:
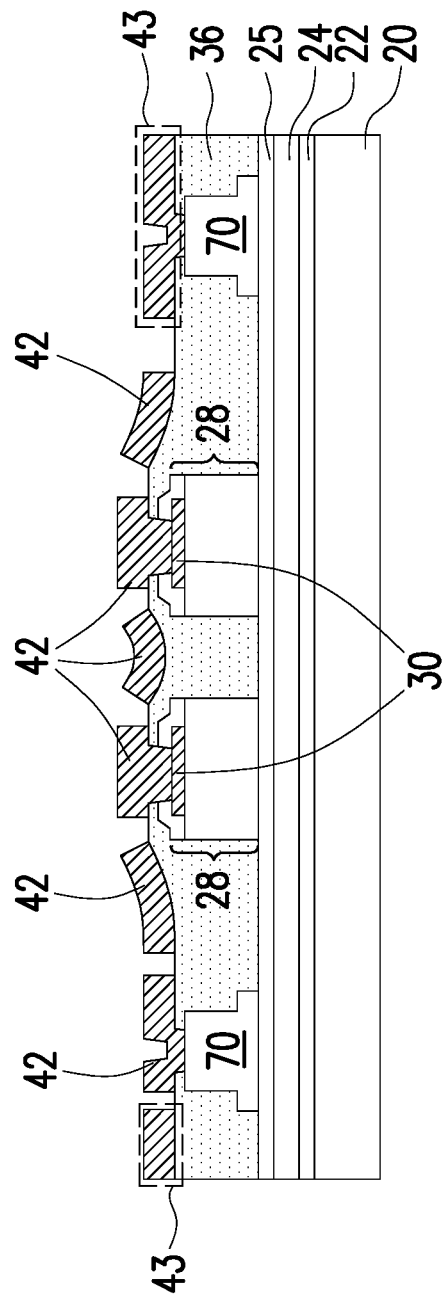

FIG. 16 illustrates the formation of metal seed layer 39, which may include a copper layer, or a titanium layer and a copper layer over the titanium layer. The respective step is illustrated as step 612 in the process flow shown in FIG. 26. Patterned mask 41, which may be formed of photo resist, is then formed over metal seed layer 39. The respective step is illustrated as step 614 in the process flow shown in FIG. 26. The material and the formation process for forming patterned mask 41 may be found referring to the discussion of FIG. 4. Next, as shown in FIG. 17, a plating process is performed to plate a metallic material, followed by a removal process for removing patterned mask 41 and an etching process for removing the portions of metal seed layer 39 directly underlying the removed patterned mask 41. As a result, RDLs 42 and seal ring extension portions 43 are formed. The respective step is illustrated as step 616 in the process flow shown in FIG. 26. RDLs 42 include first portions connected to some of metal pins 70 and second portions connected to metal pillars 30. Seal ring portions 43 form a ring encircling the region directly over package components 28. In accordance with some embodiments of the present disclosure, one or more of metal pins 70 is connected to seal ring portions 43 for electrical grounding purpose.

Figure 18:
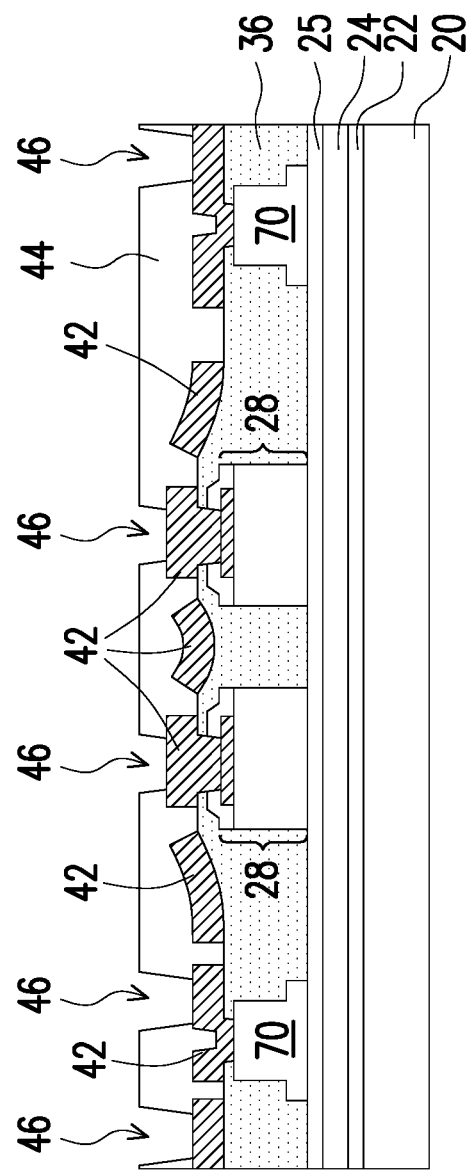
Figure 19:
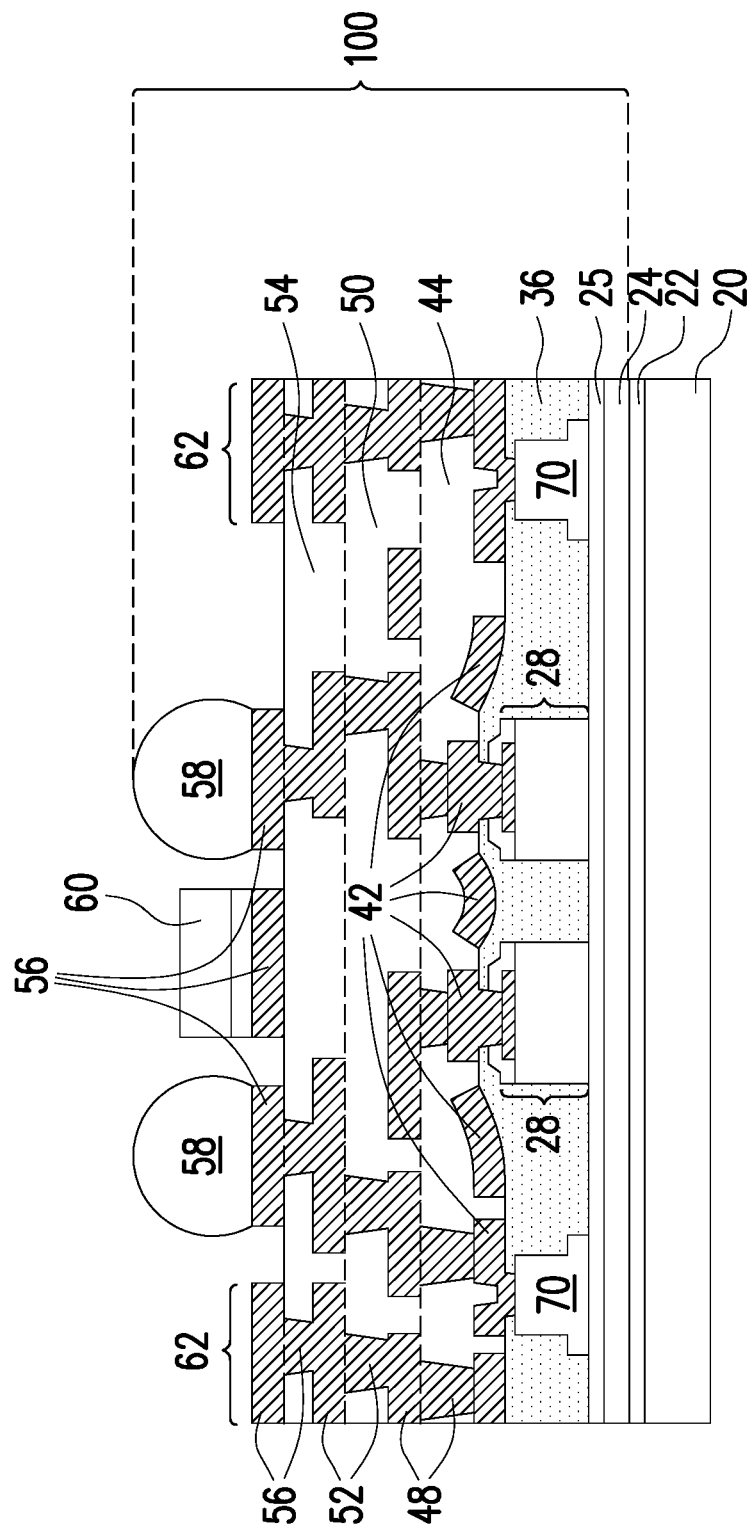

FIGS. 18 and 19 illustrate the formation of dielectric layers 44, 50, and 54 and RDLs 48, 52, and 56. The respective step is illustrated as steps 618 and 620 in the process flow shown in FIG. 26. The formation processes and the respective materials are discussed in the embodiments referring to FIGS. 6 and 7, and the details are not repeated herein. Seal ring 62 is formed to encircle RDLs 48, 52, and 56, and seal ring 62 includes extension portions 43, which are electrically connected to one of metal pins 70 for electrical grounding in the final package. IPD 60 may be bonded to RDLs 56. The respective step is illustrated as step 622 in the process flow shown in FIG. 26. Electrical connectors 58 are formed on RDLs 56. Composite wafer 100, which includes dielectric layer 24 and the overlying structure, is thus formed.

Figure 20:
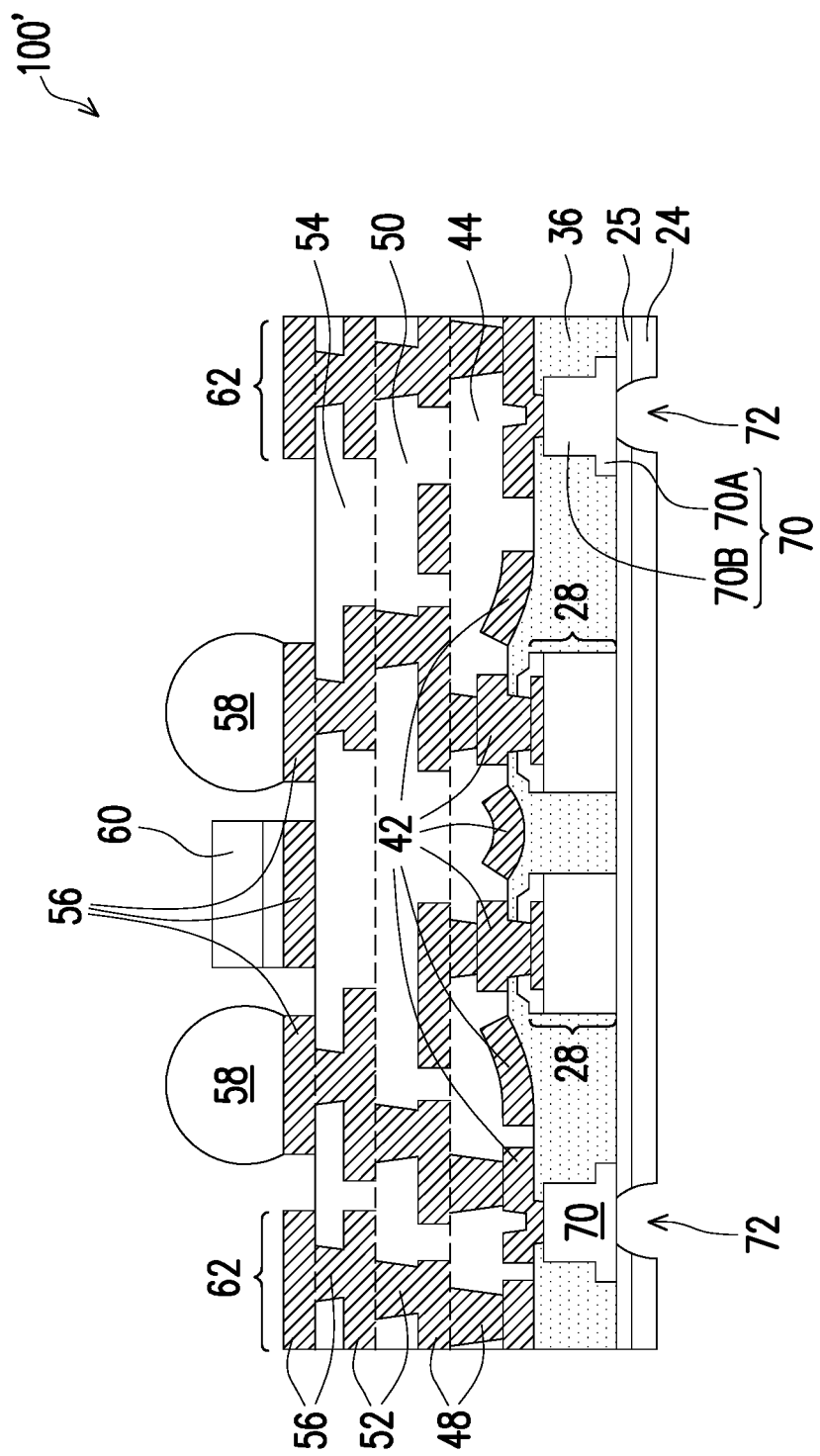

In a subsequent step, composite wafer 100 is de-bonded from carrier 20, for example, by decomposing LTHC 22 through a laser beam or UV light. The respective step is illustrated as step 624 in the process flow shown in FIG. 26. The resulting composite wafer 100 is then singulated into a plurality of packages 100', and FIG. 20 illustrates one of the resulting packages 100'. The respective step is also illustrated as step 624 in the process flow shown in FIG. 26. Metal pins 70 are then revealed by removing some portions of dielectric layer 24 and DAF 25, for example, through laser drill, thus forming openings 72. By making pin heads 70A to be larger than pin tails 70B, the process margin of the laser drill is enlarged.

Figure 21:
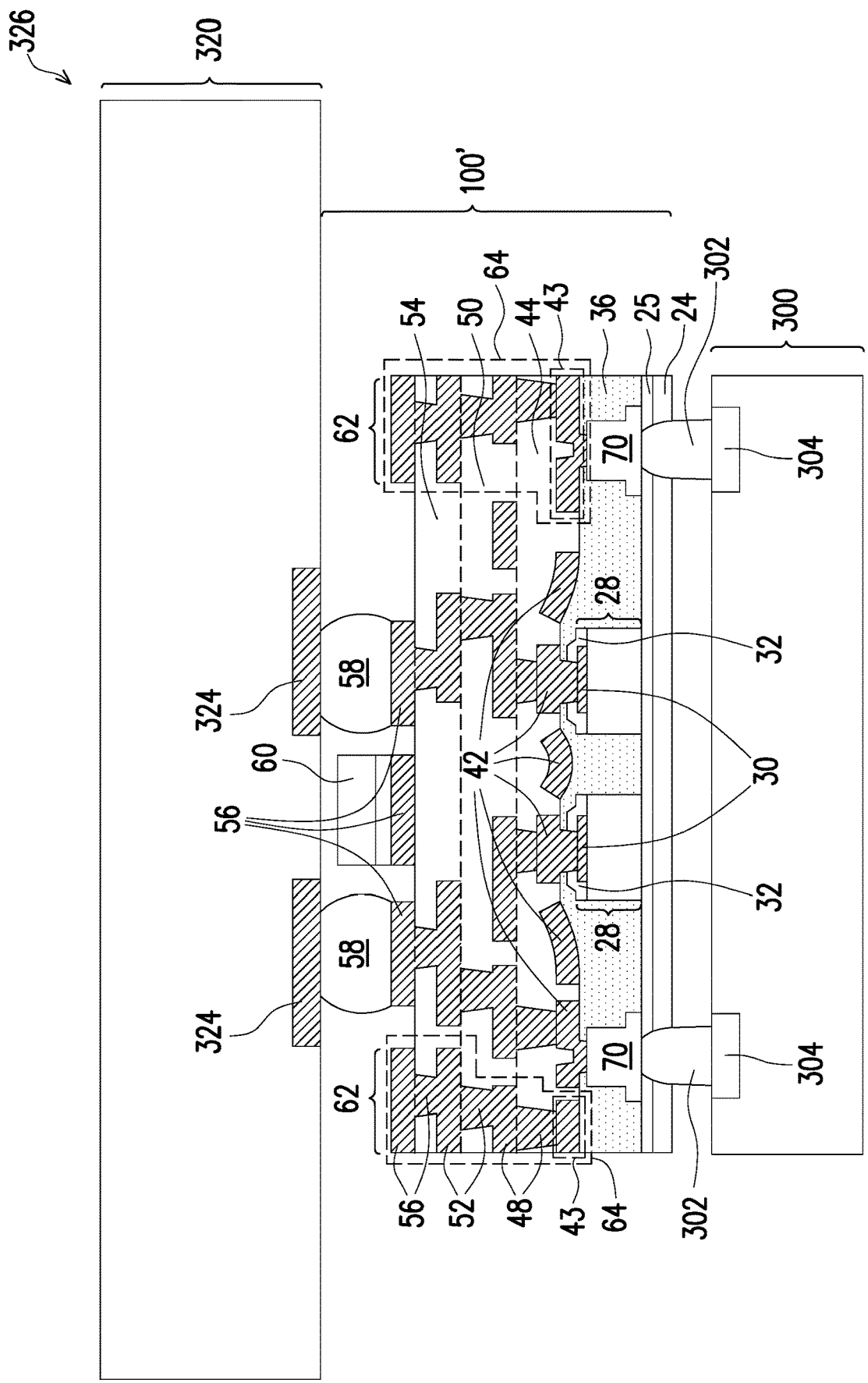

FIG. 21 illustrates the bonding of package 300 to package 100'. The respective step is illustrated as step 626 in the process flow shown in FIG. 26. The bonding is performed through solder regions 302, which join metal pins 70 to metal pads 304 in package 300. In accordance with some embodiments of the present disclosure, package 300 includes a package substrate (not shown separately) and device die(s) (not shown separately), which may be memory dies such as SRAM dies, DRAM dies, or the like.

FIG. 21 also illustrates the bonding of package component 322 to package 100', thus forming Package-on-Package (PoP) structure/package 326. The bonding is performed through solder regions 58, which join RDLs 56 to metal pads 324 in package component 320. In accordance with some embodiments of the present disclosure, package component 320 includes a package substrate, an interposer, a printed circuit board, or the like.

In accordance with some embodiments of the present disclosure, the seal ring 64 as shown in FIG. 9 and the metal pins 70 as shown in FIG. 21 are integrated in a same package 100'. The respective formation process of the package is similar to the process shown in FIGS. 10 through 21, except in the step shown in FIGS. 15A and 15B, the through-openings 38A (similar to what is shown in FIG. 3) for forming seal ring 40 is simultaneously formed when openings 38B and 38C in FIGS. 15A and 15B are formed.

In above-illustrated exemplary embodiments, some exemplary processes and features are discussed in accordance with some embodiments of the present disclosure. Other features and processes may also be included. For example, testing structures may be included to aid in the verification testing of the 3D packaging or 3DIC devices.

The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. By dispensing an encapsulating material to cover device dies and/or metal pins, the encapsulating material acts as both the encapsulating material and the dielectric layer covering the device dies. The manufacturing cost is thus reduced since the otherwise two formation processes are merged into one process. Also, the planarization process that is otherwise performed on the molding material is skipped, causing the further reduction in the manufacturing cost. The seal ring may be formed extending into the encapsulating material, resulting in the improvement in the isolation of the device dies from detrimental substances. Metal pins may be used to replace through-vias that are formed through plating, which also reduces the manufacturing cost.

In accordance with some embodiments of the present disclosure, a method includes encapsulating a package component in an encapsulating material, with the encapsulating material including a portion directly over the package component. The portion of the encapsulating material is patterned to form an opening revealing a conductive feature in the package component. A redistribution line extends into the opening to contact the conductive feature. An electrical connector is formed over and electrically coupling to the conductive feature. The method of claim 1 further includes patterning a second portion of the encapsulating material to form a through-opening penetrating through the encapsulating material, wherein the through-opening extends to a level at least coplanar with a bottom surface of the package component; and filling the through-opening to form a seal ring in the encapsulating material. In an embodiment, the seal ring comprises opposite portions on opposite sidewalls of the encapsulating material, and the method further comprises dispensing a dielectric layer, with a portion of the dielectric layer extending between the opposite portions of the seal ring. In an embodiment, the seal ring is a full ring encircling the package component. In an embodiment, the method further includes an additional seal ring over the encapsulating material, wherein the seal ring and the additional seal ring are interconnected to form an integrated seal ring. In an embodiment, the method further includes encapsulating a plurality of metal pins in the encapsulating material, wherein the encapsulating material comprises second portions directly over the metal pins, and wherein when the first portion of the encapsulating material is patterned, the second portion of the encapsulating material is simultaneously patterned to form a recess revealing the plurality of metal pins. In an embodiment, the method further includes pre-forming the plurality of metal pins; attaching the plurality of metal pins that has been formed onto an adhesive film; and attaching the package component to the adhesive film. In an embodiment, no planarization is performed on the encapsulating material, and at a time the redistribution line is formed, the first portion of the encapsulating material has a first top surface, and a second portion of the encapsulating material encircling the package component has a second top surface lower than the first top surface. In an embodiment, the encapsulating material is free from filler particles therein.

In accordance with some embodiments of the present disclosure, a method includes attaching a device die to a base layer; encapsulating the device die in an encapsulating material, wherein the encapsulating material comprises a first portion directly over the device die, and a second portion encircling the first portion; patterning the first portion of the encapsulating material to form a first opening revealing a conductive feature in the device die; patterning the second portion of the encapsulating material to form a second opening revealing the base layer; forming a redistribution line extending into the first opening; and forming a seal ring extending into the second opening. In an embodiment, the first portion and the second portion of the encapsulating material are patterned simultaneously. In an embodiment, the encapsulating material is formed of a light-sensitive material, and the patterning the first portion and the patterning the second portion of the encapsulating material comprise a light-exposure and a development. In an embodiment, the seal ring extends from a first level higher than a top surface of the device die to a second level lower than a bottom surface of the device die. In an embodiment, the seal ring fully encircles the device die. In an embodiment, in a cross-sectional view of the seal ring, the seal ring has a U-shape, and the method further comprises forming a dielectric layer over the encapsulating material, with the dielectric layer extending into the U-shape.

In accordance with some embodiments of the present disclosure, a package includes a device die; an encapsulating material encapsulating the device die therein, wherein the encapsulating material comprises: a first portion directly over the device die, wherein the first portion has a first top surface; and a second portion encircling the device die, wherein the second portion has a second top surface lower than the first top surface; a seal ring in the encapsulating material; and a first redistribution line and a second redistribution line comprising portions over the encapsulating material, wherein the first redistribution line and the second redistribution line are connected to the device die and the seal ring, respectively. The package of claim 16, wherein the seal ring penetrates through the encapsulating material, and extends from a first level higher than a top surface of the device die to a second level lower than a bottom surface of the device die. In an embodiment, the seal ring comprises opposite portions contacting the encapsulating material, and the package further comprises a dielectric material extending between the opposite portions of the seal ring. In an embodiment, the first surface is continuously and smoothly connected to the second surface. In an embodiment, the seal ring is a full ring without break in a top view of the package.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
a device die;
an encapsulating material encapsulating the device die therein, wherein the encapsulating material comprises:
   a first portion directly over the device die, wherein the first portion has a first top surface; and
   a second portion encircling the device die, wherein the second portion has a second top surface lower than the first top surface;
a seal ring in the encapsulating material; and
a first redistribution line and a second redistribution line comprising portions over the encapsulating material, wherein the first redistribution line and the second redistribution line are connected to the device die and the seal ring, respectively.

2. The package of claim 1, wherein the seal ring penetrates through the encapsulating material, and extends from a first level higher than a top surface of the device die to a second level no higher than a bottom surface of the device die.

3. The package of claim 2, wherein the seal ring comprises a first vertical portion and a second vertical portion contacting the encapsulating material, and the package further comprises a dielectric material comprising a lower portion extending between the first vertical portion and the second vertical portion of the seal ring.

4. The package of claim 3, wherein the dielectric material further comprises an additional portion overlapping the encapsulating material.

5. The package of claim 3, wherein the seal ring comprises a portion directly underlying the lower portion of the dielectric material.

6. The package of claim 1, wherein the first top surface is continuously and smoothly connected to the second top surface.

7. The package of claim 1, wherein the seal ring is a full ring without break in a top view of the package, and the seal ring encircles the device die.

8. The package of claim 1 further comprising a dielectric layer underlying and in contact with both of the encapsulating material and the seal ring.

9. A package comprising:
a first dielectric layer;
a molding compound over the first dielectric layer;
a conductive ring over the first dielectric layer, wherein the conductive ring encircles a portion of the molding compound; and
a second dielectric layer comprising:
   a first portion over the molding compound; and
   a second portion extending into the conductive ring.

10. The package of claim 9, wherein the conductive ring penetrates through the molding compound.

11. The package of claim 9 further comprising a redistribution line over and contacting the molding compound, wherein the first portion of the second dielectric layer further overlaps the redistribution line.

12. The package of claim 11 further comprising a device die encapsulated in the molding compound, wherein the redistribution line comprises a line portion, and a via portion underlying and connected to the via portion, and wherein the via portion penetrates through a portion of the molding compound to contact the device die.

13. The package of claim 9, wherein the second portion of the second dielectric layer comprises a curved top surface.

14. The package of claim 9, wherein the first dielectric layer is in physical contact with both of the molding compound and the conductive ring.

15. The package of claim 9, wherein the conductive ring comprises a U-shaped structure comprising:
   two vertical portions in contact with opposite sidewalls of the second portion of the second dielectric layer; and
   a horizontal portion overlapped by and contacting the second portion of the second dielectric layer.

16. A package comprising:
a device die comprising a conductive pad;
a molding compound encapsulating the device die therein; and
a plurality of conductive features comprising:
   a first portion over the molding compound;
   a second portion penetrating through the molding compound; and
   a third portion extending into the molding compound to contact the conductive pad of the device die.

17. The package of claim 16, wherein the second portion of the plurality of conductive features extends from a top surface level to a bottom surface level of the device die.

18. The package of claim 16, wherein the second portion of the plurality of conductive features has a U-shaped structure, and the package further comprises a dielectric layer extending into the U-shape structure.

19. The package of claim 18, wherein the U-shaped structure has a bottom portion and two vertical portions connected to opposite ends of the bottom portion, and the package further comprises a polymer extending into the U-shaped structure.

20. The package of claim 16, wherein the second portion of the plurality of conductive features forms a ring encircling the device die.

* * * * *